US012575349B2

(12) United States Patent
Lee et al.

(10) Patent No.: US 12,575,349 B2
(45) Date of Patent: Mar. 10, 2026

(54) PROCESS GAS FOR CRYOGENIC ETCHING, PLASMA ETCHING APPARATUS, AND METHOD OF FABRICATING SEMICONDUCTOR DEVICE USING THE SAME

(71) Applicant: Samsung Electronics Co., Ltd., Suwon-si (KR)

(72) Inventors: Dongkyu Lee, Suwon-si (KR); Songyun Kang, Suwon-si (KR); Hiroshi Sasaki, Suwon-si (KR); Younseon Wang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 396 days.

(21) Appl. No.: 17/874,766

(22) Filed: Jul. 27, 2022

(65) Prior Publication Data

US 2023/0230840 A1     Jul. 20, 2023

(30) Foreign Application Priority Data

Jan. 18, 2022     (KR) ........................ 10-2022-0007188

(51) Int. Cl.
*H01L 21/306*         (2006.01)
*H01J 37/32*          (2006.01)
        (Continued)

(52) U.S. Cl.
CPC .... *H01L 21/3065* (2013.01); *H01J 37/32449* (2013.01); *H01L 21/31116* (2013.01); *H01J 2237/334* (2013.01)

(58) Field of Classification Search
CPC .......... H01L 21/3065; H01L 21/31116; H01L 21/31144; H01L 21/67069;
        (Continued)

(56) References Cited

U.S. PATENT DOCUMENTS 7,608,195 B2     10/2009 Wilson
9,659,789 B2     5/2017 Takeda et al.
            (Continued)

FOREIGN PATENT DOCUMENTS

KR      10-2020-0090244 A      7/2020
KR      10-2020-0092411 A      8/2020
            (Continued)

OTHER PUBLICATIONS

Yoshinori Kataoka et al., "Enhancement of Etching Rate of SiN Films by Addition of Gases Containing Hydrogen to CF4/O2", Journal of the Electrochemical Society, 146 (9), 3435-3439 (1999).
            (Continued)

*Primary Examiner* — Duy Vu N Deo
(74) *Attorney, Agent, or Firm* — HARNESS, DICKEY & PIERCE, P.L.C.

(57)          ABSTRACT

A method of fabricating a semiconductor device comprises forming a mold layer on a substrate, forming a hardmask layer on the mold layer such that a portion of the mold layer is exposed, and using the hardmask layer to perform on the mold layer a cryogenic etching process. The cryogenic etching process includes supplying a chamber with a process gas including first and second process gases, and generating a plasma from the process gas. Radicals of the first process gas etch the exposed portion of the mold layer. Ammonium salt is produced based on the radicals etching the exposed portion of the mold layer. The second process gas includes an R—OH compound. The R is hydrogen, a C1 to C5 alkyl group, a C2 to C6 alkenyl group, a C2 to C6 alkynyl group, or a phenyl group. The second process gas reduces a production rate of the ammonium salt.

18 Claims, 26 Drawing Sheets

(51) Int. Cl.
  H01L 21/3065 (2006.01)
  H01L 21/311 (2006.01)

(58) Field of Classification Search
  CPC ........... H01L 21/02164; H01L 21/0217; H01L 21/022; H01L 21/67109; H01J 37/32449; H01J 2237/334; H01J 37/32091; H01J 37/32724; H01J 37/32009; H01J 37/3244; C09K 13/00
  USPC .................. 216/106; 438/706–714, 723, 724
  See application file for complete search history.

(56) References Cited

U.S. PATENT DOCUMENTS

| | | | |
|---|---|---|---|
| 9,997,374 | B2 | 6/2018 | Takeda et al. |
| 10,410,877 | B2 | 9/2019 | Takashima et al. |
| 10,529,581 | B2 | 1/2020 | Hsu et al. |
| 10,600,654 | B2 | 3/2020 | Tomura et al. |
| 10,692,729 | B2 | 6/2020 | Kudo et al. |
| 10,937,652 | B1 * | 3/2021 | Tien et al. .......... H01L 21/0337 |

| | | | |
|---|---|---|---|
| 2007/0186953 | A1 * | 8/2007 | Mitsunari et al. .... H01L 21/311 |
| 2019/0198333 | A1 * | 6/2019 | Tokashiki ......... H01L 21/67109 |
| 2020/0035501 | A1 | 1/2020 | Tabata et al. |
| 2020/0194272 | A1 * | 6/2020 | Jain ................... H01L 21/31116 |
| 2021/0005472 | A1 | 1/2021 | Kanarik et al. |
| 2021/0098263 | A1 * | 4/2021 | Ishikawa .......... H01L 21/02274 |
| 2021/0313187 | A1 | 10/2021 | Ito et al. |

FOREIGN PATENT DOCUMENTS

| | | |
|---|---|---|
| KR | 10-2020-0123481 A | 10/2020 |
| KR | 10-2021-0044790 A | 4/2021 |

OTHER PUBLICATIONS

Kazunori Shinoda et al., "Self-limiting reactions of ammonium salt in CHF3/02 downstream plasma for thermal-cyclic atomic layer etching of silicon nitride", J Vac. Sci. Technol. A 37, 051002 (2019).
Nobuya Miyoshi et al., "Atomic layer etching of Si3N4 with high selectivity to SiO2 and poly—Si", J. Vac. Sci. Technol. A 39, 052601 (2021).

* cited by examiner

FIG. 10

PROCESS GAS FOR CRYOGENIC ETCHING, PLASMA ETCHING APPARATUS, AND METHOD OF FABRICATING SEMICONDUCTOR DEVICE USING THE SAME

CROSS-REFERENCE TO RELATED APPLICATION

This U.S. nonprovisional application claims priority under 35 U.S.C § 119 to Korean Patent Application No. 10-2022-0007188 filed on Jan. 18, 2022 in the Korean Intellectual Property Office, the disclosure of which is hereby incorporated by reference in its entirety.

BACKGROUND

The present inventive concepts relate to process gases for cryogenic etching, plasma etching apparatuses, and methods of fabricating a semiconductor device using the same.

An electronic system requiring data storage needs a semiconductor device capable of storing high-capacity data. Thus, a study is conducted to increase data storage capacity of a semiconductor device. For example, as one of approaches to increase data storage capacity, a semiconductor device is suggested to include three-dimensionally arranged memory cells instead of two-dimensionally arranged memory cells.

A semiconductor device is fabricated by a plurality of unit processes including a film deposition process and an etching process, and the etching process is performed by using a plasma etching apparatus in which a plasma reaction is mainly induced. Recently, a plasma etching may be executed at low temperatures to securely obtain a high selectivity when forming a structure having a high aspect ratio or when using a photoresist layer to etch a wafer.

SUMMARY

Some example embodiments of the present inventive concepts provide cryogenic etching processes capable of reducing or preventing process defects such as etching interruption.

Some example embodiments of the present inventive concepts provide plasma etching apparatuses in which cryogenic etching processes are performed.

Some example embodiments of the present inventive concepts provide process gases used for cryogenic etching processes.

According to some example embodiments of the present inventive concepts, a method of fabricating a semiconductor device may comprise: forming a mold layer on a substrate; forming a hardmask layer on an upper surface of the mold layer such that a portion of the mold layer is exposed by the hardmask layer; and using the hardmask layer to perform on the mold layer a cryogenic etching process that uses plasma. The cryogenic etching process may include: supplying a chamber in which the substrate, the mold layer, and the hardmask layer are located with a process gas, the process gas including a first process gas and a second process gas, the second process gas including an R—OH compound, where R is hydrogen, a C1 to C5 alkyl group, a C2 to C6 alkenyl group, a C2 to C6 alkynyl group, or a phenyl group; and generating the plasma from the process gas, such that radicals of the first process gas etch the portion of the mold layer that is exposed by the hardmask layer, ammonium salt is produced based on the radicals of the first process gas etching the portion of the mold layer that is exposed by the hardmask layer, and the second process gas reduces a production rate of the ammonium salt that is produced during the cryogenic etching process.

According to some example embodiments of the present inventive concepts, a plasma etching apparatus may comprise: a chamber; a gas distribution part on an upper portion of the chamber; a pedestal on a lower portion of the chamber and configured to support a substrate; and a first gas supply source and a second gas supply source that are connected to the gas distribution part. The first gas supply source may supply the gas distribution part with a first process gas. The second gas supply source may supply the gas distribution part with a second process gas including an R—OH compound. The symbol R may be hydrogen, a C1 to C5 alkyl group, a C2 to C6 alkenyl group, a C2 to C6 alkynyl group, or a phenyl group. The plasma etching apparatus may be configured to generate a plasma based on using the gas distribution part and the pedestal as a top electrode and a bottom electrode for generating plasma. The plasma may produce radicals from the first process gas. The radicals may etch an etch-target layer. The pedestal may include a coolant passage that is configured to cool the substrate.

According to some example embodiments of the present inventive concepts, a process gas for cryogenic etching may comprise: a first process gas that is configured to produce radicals, the radicals configured to etch an etch-target layer; and a second process gas that is configured to suppress ammonium salt from being produced based on a reaction between the radicals and the etch-target layer. The second process gas may include an R—OH compound. The symbol R may be hydrogen, a C1 to C5 alkyl group, a C2 to C6 alkenyl group, a C2 to C6 alkynyl group, or a phenyl group.

BRIEF DESCRIPTION OF THE DRAWINGS

FIG. 10 illustrates a plan view showing a semiconductor device according to some example embodiments of the present inventive concepts.

3

Figure 1:
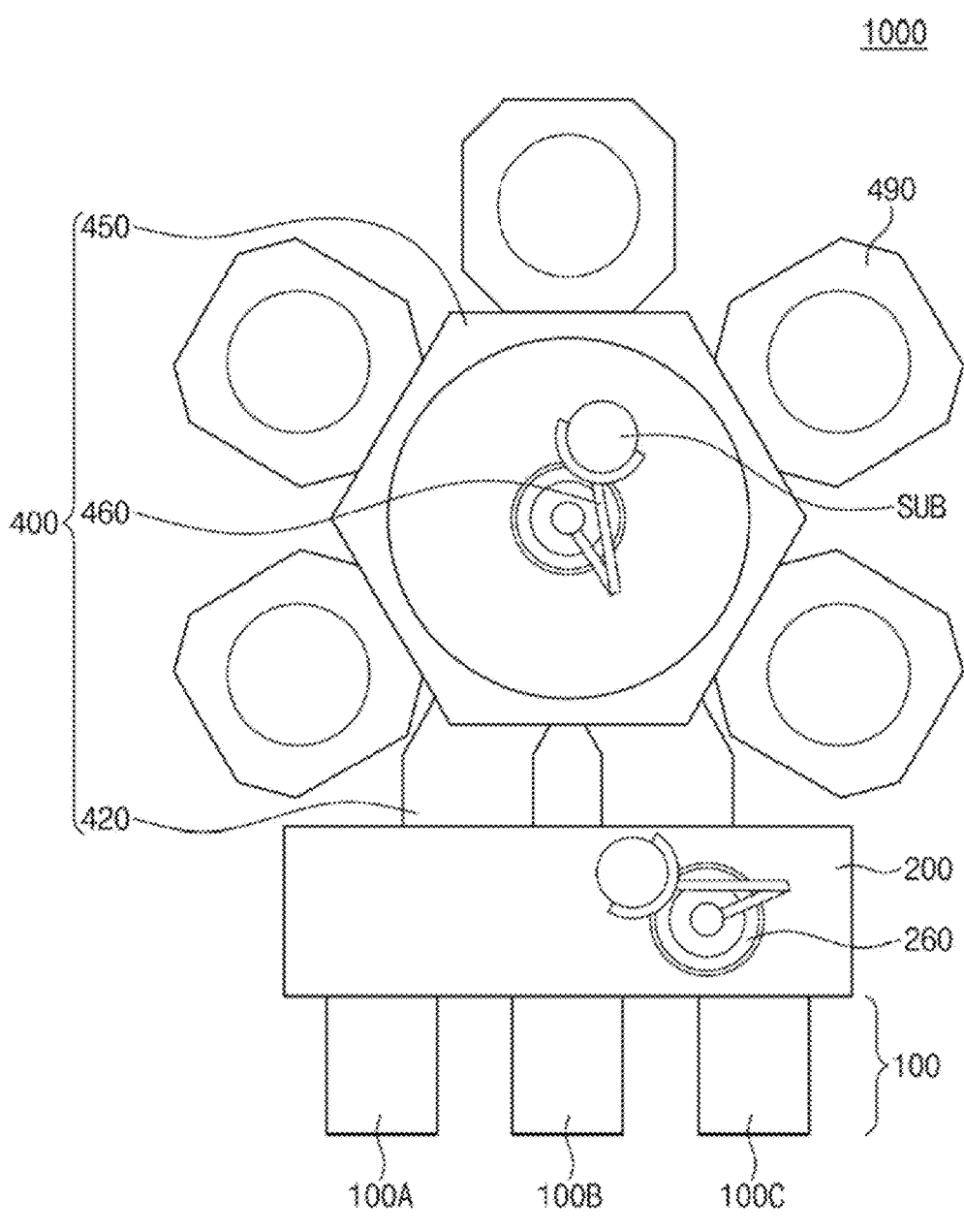
FIG. 1 illustrates a simplified schematic diagram showing a plasma etching system according to some example embodiments of the present inventive concepts.

10, showing a method of fabricating a semiconductor device according to some example embodiments of the present inventive concepts.

Figure 10:
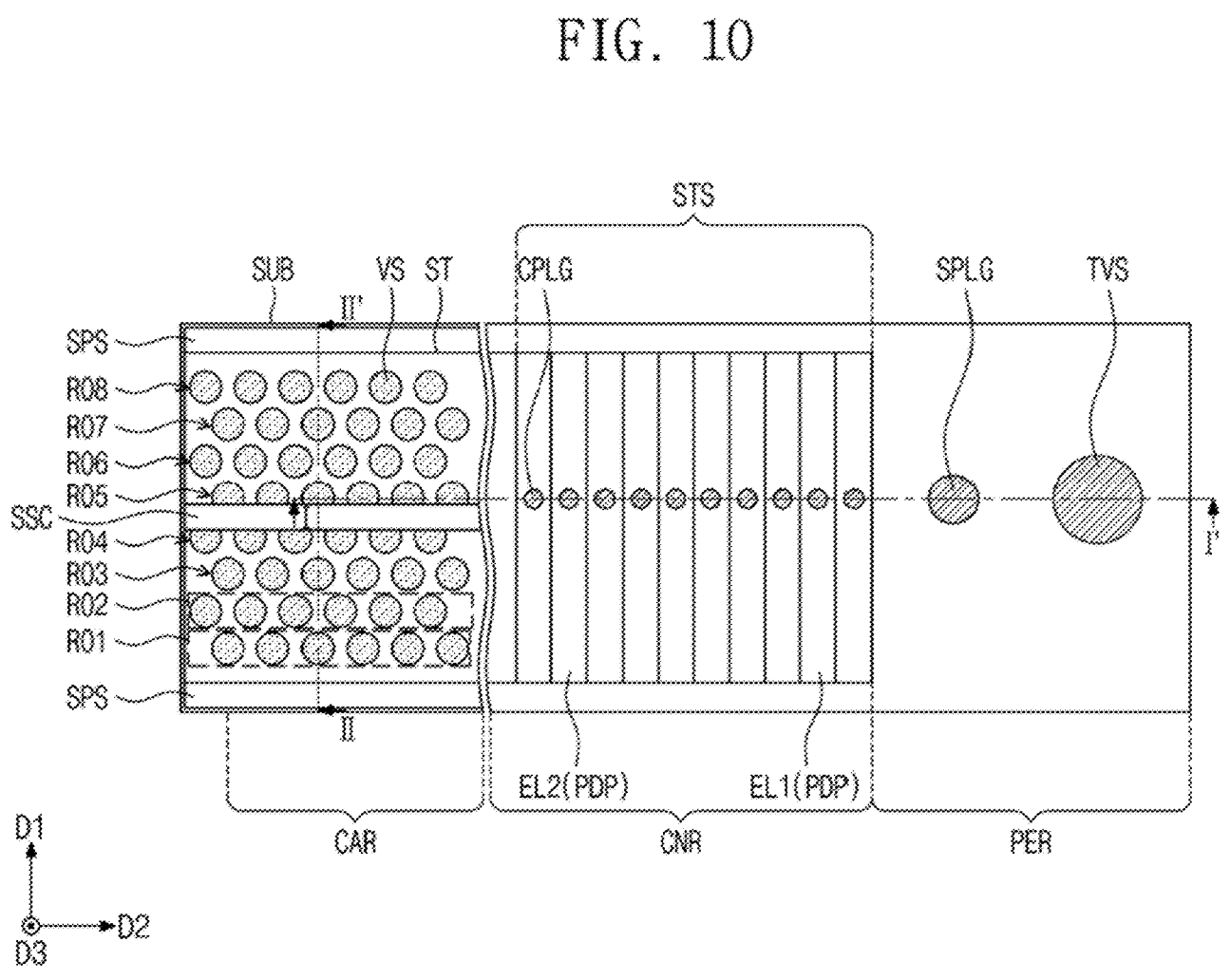

FIGS. 12B, 13B, 14B, 15B, 16B, 17B, 18B, and 19B illustrate cross-sectional views taken along line II-IF of FIG. 10, showing a method of fabricating a semiconductor device according to some example embodiments of the present inventive concepts.

DETAILED DESCRIPTION

Hereinafter, example embodiments of the inventive concepts will be described in detail with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

FIG. 1 illustrates a simplified schematic diagram showing a plasma etching system according to some example embodiments of the present inventive concepts.

Referring to FIG. 1, a plasma etching system 1000 according to some example embodiments may include a load port 100, a transfer module 200, and a process module 400. The load port 100 may include a plurality of ports 100A, 100B, and 100C. Each of the ports 100A, 100B, and 100C may include a container in which a plurality of wafers are received. The process module 400 may include a load-lock chamber 420, a transfer chamber 450, and a plurality of process chambers 490.

Figure 2:
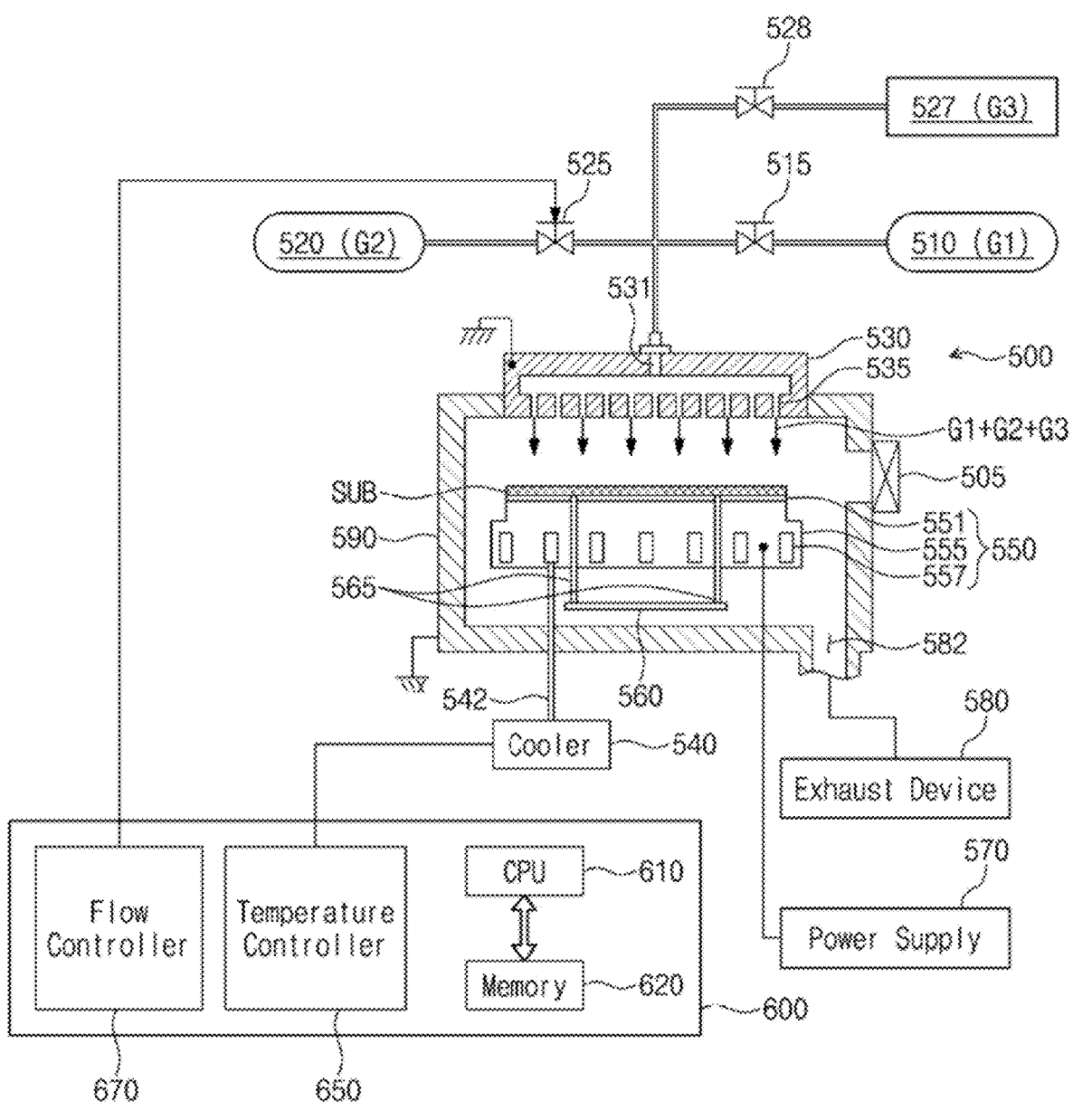
FIG. 2 illustrates a cross-sectional view showing a plasma etching apparatus according to some example embodiments of the present inventive concepts.

At least one of the process chambers 490 according to some example embodiments may be a chamber for performing a plasma etching process, and for example, may correspond to a plasma etching apparatus 500 illustrated in FIG. 2. Another of the process chambers 490 may be a chamber for a treatment process such as cleaning or deposition.

The transfer module 200 may allow a substrate SUB to transfer between the load port 100 and the process module 400. The substrate SUB may be a semiconductor wafer (e.g., silicon wafer). The transfer module 200 may have an internal space separated from outside, and the internal space may be provided therein with a transfer robot 260 for transferring the substrate SUB.

The transfer robot 260 may include an arm that is movable in horizontal and vertical directions and a rotation plate to which the arm is rotationally fixed. The transfer robot 260 may unload the substrate SUB from the load port 100 and then may transfer the substrate SUB to the process module 400, or may unload the substrate SUB from the process module 400 and then may transfer the substrate SUB to the load port 100.

The load-lock chamber 420 may allow the substrate SUB to transfer between the transfer chamber 450 and the transfer module 200. The load-lock chamber 420 may decompress its internal space to vacuum pressure or may pressurize its internal space to atmospheric pressure.

The transfer chamber 450 may include an internal space that can be connected to the load-lock chamber 420 and the process chamber 490. The transfer chamber 450 may be provided in its internal space with a transfer robot 460 configured to transfer the substrate SUB.

FIG. 2 illustrates a cross-sectional view showing a plasma etching apparatus according to some example embodiments of the present inventive concepts. A plasma etching apparatus 500 illustrated in FIG. 2 may be an example of at least one process chamber 490 of the plasma etching system 1000 shown in FIG. 1.

Referring to FIG. 2, the plasma etching apparatus 500 according to some example embodiments may include a chamber 590, a gas distribution part 530 provided on an upper portion of the chamber 590, and a pedestal 550.

The plasma etching apparatus 500 may generate plasma by using a direct plasma method, a remote plasma method, a radio-frequency (RF) plasma method, a microwave plasma method, an inductively coupled plasma method, a capacitively coupled plasma method, or an electron cyclotron resonance plasma method.

In some example embodiments, the plasma etching apparatus 500 may be a capacitively coupled plasma etching apparatus. For example, the plasma etching apparatus 500 may be a dual-frequency capacitively coupled plasma etching apparatus.

The chamber 590 may provide a hermetic space for performing a plasma etching process. The chamber 590 may be provided in various forms in accordance with a shape and size of the substrate SUB. The chamber 590 may include at least one of metal or dielectric.

The pedestal 550 may be disposed in a lower portion of the chamber 590 and may be used as a support structure for supporting the substrate SUB (e.g., may be configured to structurally support the weight, load, etc. of the substrate SUB). The pedestal 550 may include a support 555 and an electrostatic chuck 551 disposed on the support 555. The electrostatic chuck 551 may use a Coulomb's force to electrostatically adsorb the substrate SUB. For example, the electrostatic chuck 551 may include a ceramic layer in which an electrode is embedded.

The pedestal 550 according to some example embodiments may include a lift assembly 560 equipped with a lift pin 565. The lift pin 565 may penetrate the pedestal 550. The lift pin 565 may lift the substrate SUB positioned on the pedestal 550 or may lower the substrate SUB to contact the electrostatic chuck 551.

A coolant passage 557 may be provided within the support 555 according to some example embodiments. The coolant passage 557 may circulate a coolant in the support 555. The coolant passage 557 may be connected through a pipe 542 to a cooler 540. The coolant circulation may allow the substrate SUB disposed on the pedestal 550 to cool to a target temperature. For example, the coolant passage 557 may cool the substrate SUB to a temperature ranging from about −150° C. to about 0° C.

For the plasma etching apparatus 500, the gas distribution part 530 and the pedestal 550 may be used as a top electrode and a bottom electrode, respectively. The pedestal 550 may be electrically connected with a power supply 570 that supplies power. The power supply 570 may provide radio-frequency power for plasma generation.

The gas distribution part 530 may be electrically grounded as illustrated in FIG. 2. In some example embodiments, the gas distribution part 530 may be electrically connected to a direct-current source capable of applying a direct current (DC) voltage.

The gas distribution part 530 may include a gas inlet port 531 connected to pipes of first, second, and third gas supply sources 510, 520, and 527. A process gas G1+G2+G3 supplied from the gas inlet port 531 may be injected through a plurality of injection holes 535 onto the substrate SUB positioned on the pedestal 550.

A controller 600 may control a first valve 515 to adjust a flow rate of a first process gas G1. The controller 600 may control a second valve 525 to adjust a flow rate of a second process gas G2. The controller 600 may control a third valve 528 to adjust a flow rate of a third process gas G3. The process gas G1+G2+G3 may be a mixture of the first process gas G1, the second process gas G2, and the third process gas G3.

The first gas supply source 510 may supply the first process gas G1 for generating plasma. The plasma may produce radicals of the first process gas G1, and the radicals may etch (or chemically decompose) a mold layer on the substrate SUB. The first process gas G1 may be a gas capable of producing radicals that etch a mold layer (or etch-target layer) in a cryogenic etching process.

The first process gas G1 may include one or more of a fluorine-containing gas and a hydrogen-containing gas. The first process gas G1 may include at least one of Hz, CxFy, CxHyFz, SFx, TiClx, WFx, or WClx. The subscripts x, y, and z may independently be an integer between 1 and 50. For example, the first process gas G1 may include at least one of $H_2$, $CF_4$, $C_4F_6$, $C_4F_8$, $CHF_3$, $SF_6$, $NF_3$, $XeF_2$, $TaF_5$, $IF_7$, HF, $ClF_3$, $BrF_3$, $AsF_5$, PF5, $NbF_5$, $BiF_5$, $UF_5$, $SiCl_4$, $TaCl_5$, $HfCl_4$, or $CoCl_2$.

The first process gas G1 of the present inventive concepts, however, is not limited to the material mentioned above. Any material to etch a mold layer (or etch-target layer) under plasma may be used without limitation as the first process gas G1 of the present inventive concepts.

In some example embodiments of the present inventive concepts, the first process gas G1 may include at least one a C—F bond in a cryogenic plasma etching process. For example, a fluorine-rich gas, such as $CF_4$, may be used as the first process gas G1 in a cryogenic plasma etching process according to the present inventive concepts.

The second gas supply source 520 may supply a second process gas G2 that suppresses production of ammonium salt. The second process gas G2 may include an R—OH compound (e.g., a compound represented by the Chemical Equation R—OH). The symbol R (e.g., the symbol R in the Chemical Equation R—OH) may be hydrogen, a C1 to C5 alkyl group, a C2 to C6 alkenyl group, a C2 to C6 alkynyl group, or a phenyl group. For example, the second process gas G2 may include water (vapor) or alcohol. For more detail, the second process gas G2 may include one or more of methanol and ethanol. The second gas supply source 520 may include an evaporator. The evaporator may evaporate alcohol or water in a liquid state to produce the second process gas G2.

The third gas supply source 527 may supply a third process gas G3 that includes at least one of oxygen ($O_2$), nitrogen ($N_2$), or an inert gas. The inert gas may include at least one of He, Ne, Ar, Kr, or Xe. In some example embodiments of the present inventive concepts, the third gas supply source 527 may be omitted.

The first, second, and third process gases G1, G2, and G3 supplied form the first, second, and third gas supply sources 510, 520, and 527 may be mixed with each other to produce a mixed process gas G1+G2+G3 that is supplied through the gas distribution part 530 into the chamber 590.

An exhaust port 582 may be provided on a bottom surface of the chamber 590. The chamber 590 may be exhausted by the exhaust device 580 through the exhaust port 582. The chamber 590 may be decompressed to maintain a target vacuum level.

The chamber 590 may be provided on its sidewall with a gate 505 that opens or closes an internal space of the chamber 590. The internal space of the chamber 590 may be connected through the gate 505 to the transfer chamber 450 depicted in FIG. 1. The substrate SUB may be loaded through the gate 505 into the chamber 590 or unloaded through the gate 505 from the chamber 590.

The plasma etching apparatus 500 may include a controller 600 that controls an overall operation thereof. The controller 600 may include a central processing unit (CPU) 610, a memory 620 that includes one or more of a read-only memory (ROM) and a random access memory (RAM), a temperature controller 650, and a flow controller 670. The temperature controller 650 may be connected to the cooler 540 to control a temperature for cryogenic plasma etching. The flow controller 670 may be connected to the second valve 525 to adjust a supply amount (or flow rate) of the second process gas G2 during a cryogenic plasma etching process. A flow rate of the second process gas G2 may be adjusted to control a production rate of ammonium salt during a cryogenic plasma etching process.

The CPU 610 may perform a process required according to a cryogenic plasma etching recipe stored in the memory 620. The recipe may include information such as a process time, pressure, a radio-frequency power, a flow rate of process gas, a chamber temperature, and a temperature of the cooler 540.

The controller 600 may be configured to control the operation of any or all elements of the plasma etching system 1000 and/or the plasma etching apparatus 500, for example based on generating and transmitting control signals to any or all of the elements thereof. The controller 600 may be communicatively coupled to any elements of the plasma etching system 1000 and/or the plasma etching apparatus 500. The controller 600 may be configured to (based on, for example, a processor thereof executing a program of instructions stored at a memory thereof) cause one or more operations of any of the methods of the example embodiments to be performed based on generating one or more command signals and transmitting the command signals to one or more of any elements of the plasma etching system 1000 and/or the plasma etching apparatus 500 to cause the plasma etching system 1000 and/or the plasma etching apparatus 500 to cause the one or more operations to be performed based on operation of the one or more of any elements of the plasma etching system 1000 and/or the plasma etching apparatus 500 in response to the one or more command signals.

As described herein, any devices, systems, blocks, modules, units, controllers, circuits, apparatus, and/or portions thereof according to any of some example embodiments (including, without limitation, any of the example embodiments of the controller 600, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, blocks, modules, units, controllers, circuits, apparatuses, and/or portions thereof according to any of some example embodiments, and/or any portions thereof, including for example some or all operations of any of the methods and/or processes shown in any of the drawings.

As illustrated in FIG. 2, the substrate SUB loaded on the pedestal 550 may be adsorbed and held by a Coulomb's force onto the electrostatic chuck 551. The cooler 540 may cool the pedestal 550, and plasma may be generated from the process gas G1+G2+G3 for etching, with the result that a cryogenic etching process may be performed.

The process gas G1+G2+G3 for plasma generation may be provided into the gas distribution part 530 from the first, second, and third gas supply sources 510, 520, and 527. The process gas G1+G2+G3 may be injected through the gas distribution part 530 into the chamber 590. As the pedestal 550 is supplied with radio-frequency power, plasma may be generated from the process gas G1+G2+G3 injected into the chamber 590. The generated plasma may be used to perform a plasma etching process on the substrate SUB.

A plasma etching process according to the present inventive concepts may be performed as a cryogenic etching process. The cryogenic etching process may have a high selectivity with respect to a mold layer on the substrate SUB.

The cryogenic etching process according to the present inventive concepts may form in the mold layer a hole (or trench) whose aspect ratio is high.

Figure 3:
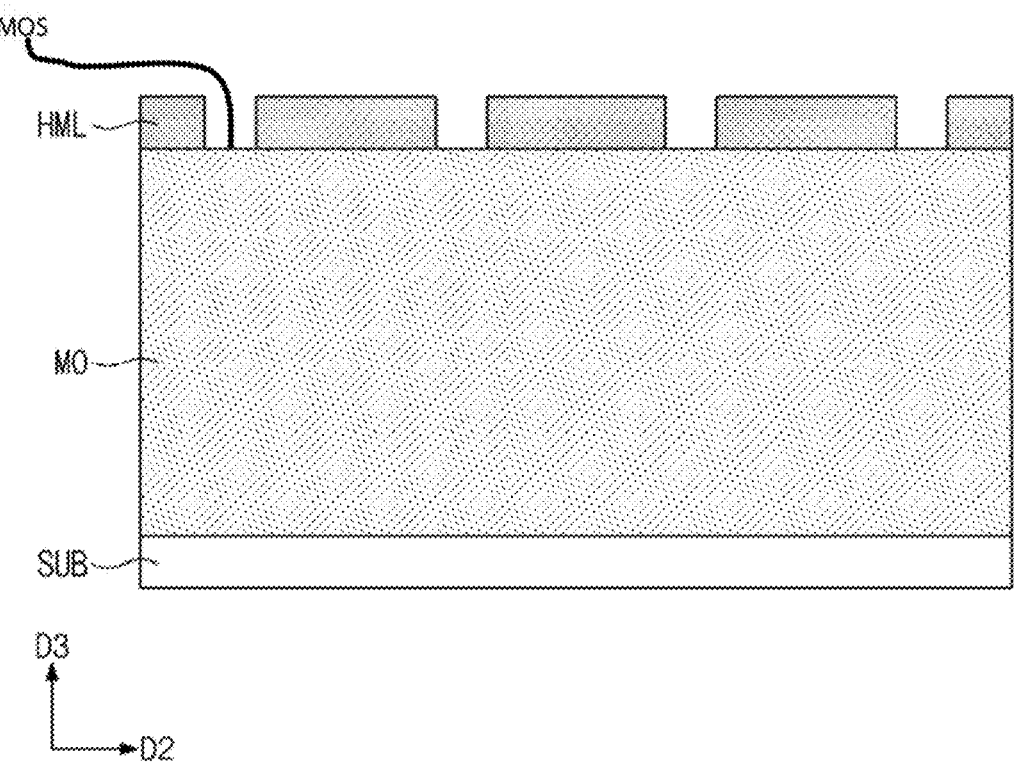
FIGS. 3 and 4 illustrate cross-sectional views showing a cryogenic etching process performed on a mold layer according to some example embodiments of the present inventive concepts.
Figure 4:
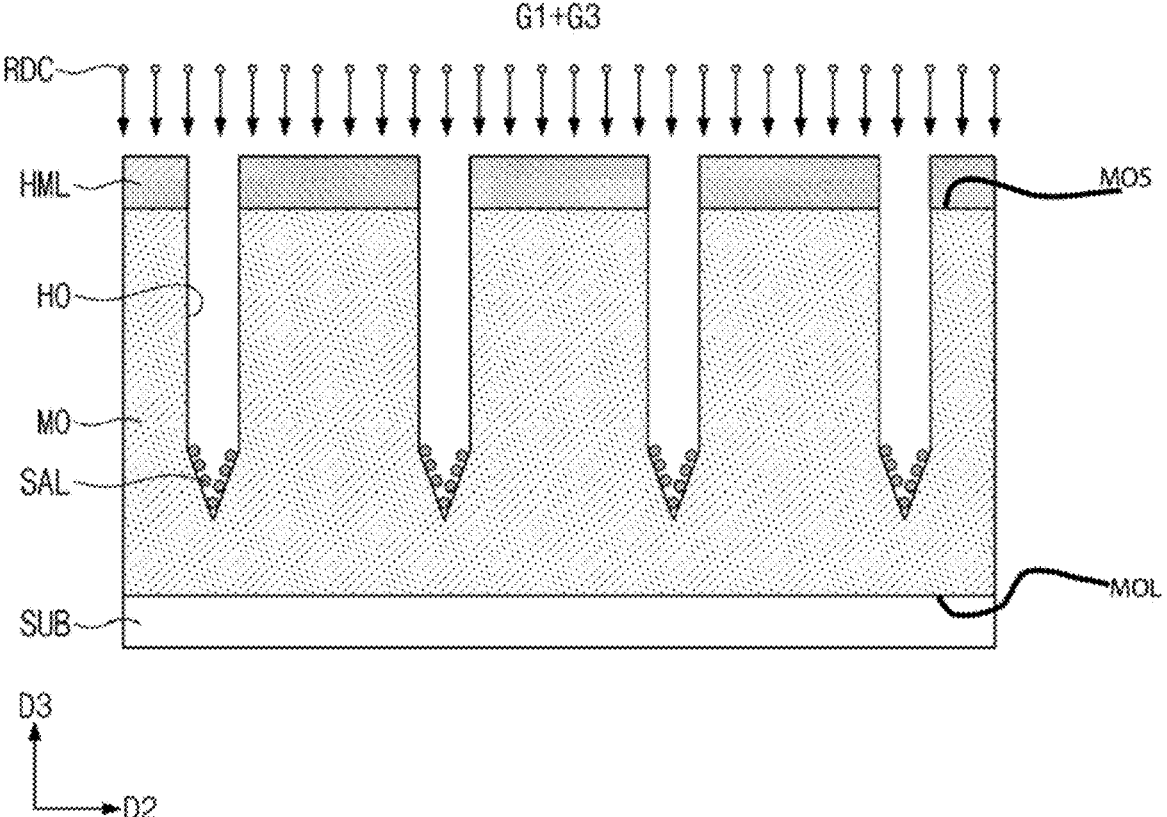

FIGS. 3 and 4 illustrate cross-sectional views showing a cryogenic etching process performed on a mold layer according to some example embodiments of the present inventive concepts.

Referring to FIG. 3, a mold layer MO may be formed on a substrate SUB. For example, the substrate SUB may be a silicon wafer. In some example embodiments of the present inventive concepts, the mold layer MO may be a structure in which at least two different layers are stacked alternately with each other. For example, the mold layer MO may be a stack structure in which at least one silicon oxide layer and at least one silicon nitride layer are stacked alternately with each other. In some example embodiments of the present inventive concepts, the mold layer MO may be a single layer such as a silicon oxide layer or a silicon nitride layer. The mold layer MO may be formed on a top surface of the substrate SUB.

A hardmask layer HML may be formed on the mold layer MO (e.g., on the upper surface MOS of the mold layer MO. The hardmask layer HML may be an etching mask for etching the mold layer MO. For example, the hardmask layer HML may include an amorphous carbon layer. The hardmask layer HML may be patterned by a photolithography process. As shown, the hardmask layer HML may (e.g., based on being patterned) cause one or more portions of the mold layer MO to be exposed by the hardmask layer HML.

Referring to FIG. 4, the patterned hardmask layer HML may be used as an etching mask to perform a cryogenic etching process on the mold layer MO. The cryogenic etching process of FIG. 4 may be performed by the plasma etching apparatus 500 discussed above with reference to FIG. 2. However, the second gas supply source 520 of FIG. 2 may be omitted in the cryogenic etching process according to the some example embodiments. For example, the second process gas G2 as a process gas may be omitted in the cryogenic etching process according to the some example embodiments.

A cryogenic etching process according to the present inventive concepts may be performed at low or extremely low temperatures. For example, the cryogenic etching process according to the present inventive concepts may be executed at a temperature ranging from about −150° C. to about 0° C. For more detail, the cryogenic etching process may be performed at a temperature ranging from about −100° C. to about 0° C. The coolant passage 557 of FIG. 2 may be used to cool the substrate SUB to a temperature ranging from about −150° C. to about 0° C. For example, a process temperature at which the mold layer MO on the substrate SUB is etched may reach about −150° C. to about 0° C.

Radicals RDC may be produced by plasma from a process gas G1+G2 supplied into the chamber 590 through the gas distribution part 530 of FIG. 2. For example, radicals RDC, such as F and H, may be produced by plasma from the first process gas G1. The radicals RDC may be provided to the mold layer MO exposed by the hardmask layer HML (e.g., the portion(s) of the mold layer MO exposed by the hardmask layer HML), and thus the mold layer MO (e.g., the exposed portion(s) thereof) may be etched (or chemically decomposed) by a chemical reaction. The mold layer MO may be etched such that a hole HO may be formed in the mold layer MO.

During the etching of the mold layer MO, ammonium salt SAL in a solid state may be produced by chemical reactions expressed by the following chemical equations. For example, the ammonium salt SAL may include ammonium fluorosilicate ($(NH_4)_2SiF_6$). The following chemical equations may illustrate by way of example a case where the mold layer MO includes a silicon nitride layer. Each of fluorine (F) and hydrogen (H) in the following chemical equations may be the radical RDC produced by plasma. Accordingly, it will be understood that ammonium salt SAL may be produced based on the radicals RDC produced by plasma etching at least the portion of the mold layer MOP exposed by the hardmask layer HML.

$$SiN+4F(g)+3H(g) \rightarrow SiF_4(g)+NH_3(g)$$

$$F(g)+H(g) \rightarrow HF(g)$$

$$2NH_3(g)+2HF(g)+SiF_4(g) \rightarrow (NH_4)_2SiF_6(s)\downarrow$$

Figure 5:
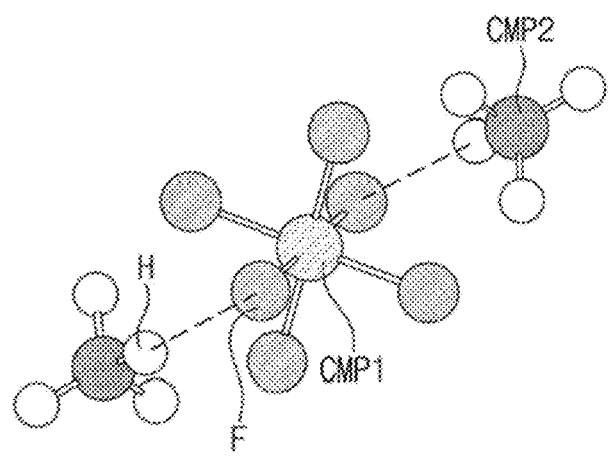
FIG. 5 illustrates a chemical structure of ammonium fluorosilicate according to some example embodiments of the present inventive concepts.

FIG. 5 shows a chemical structure of ammonium fluorosilicate that is representative of the ammonium salt SAL according to some example embodiments of the present inventive concepts. The ammonium fluorosilicate may include a hydrogen bond between a first compound CMP1, which is a fluorosilicate, and a second compound CMP2, which is an ammonium ion. For example, the hydrogen bond may occur between a fluorine atom F of the first compound CMP1 and a hydrogen atom H of the second compound CMP2. As the first compound CMP1 and the second compound CMP2 are strongly bonded to each other through the hydrogen bond, a compound of FIG. 5 may have an extremely stable state. In a reaction that produces the compound of FIG. 5, a change (ΔG) in Gibbs free energy may have a relatively small value (e.g., negative value).

The ammonium salt SAL of FIG. 5 may be continuously produced during the cryogenic etching process (e.g., produced based on the radicals RDC produced by plasma etching at least the portion of the mold layer MOP exposed by the hardmask layer HML). As illustrated in FIG. 4, the hole HO may extend from the upper surface MOS of the mold layer MO towards an opposite, lower surface MOL of the mold layer MO. As illustrated in FIG. 4, the ammonium salt SAL may compel the hole HO to have a diameter that decreases with decreasing distance from the substrate SUB. The ammonium salt SAL produced in a lower portion of the hole HO may impede the etching of the mold layer MO and may induce etching interruption. As a result, the etching of the hole HO may be interrupted in the mold layer MO and accordingly the hole HO may not penetrate the mold layer MO.

Figure 6:
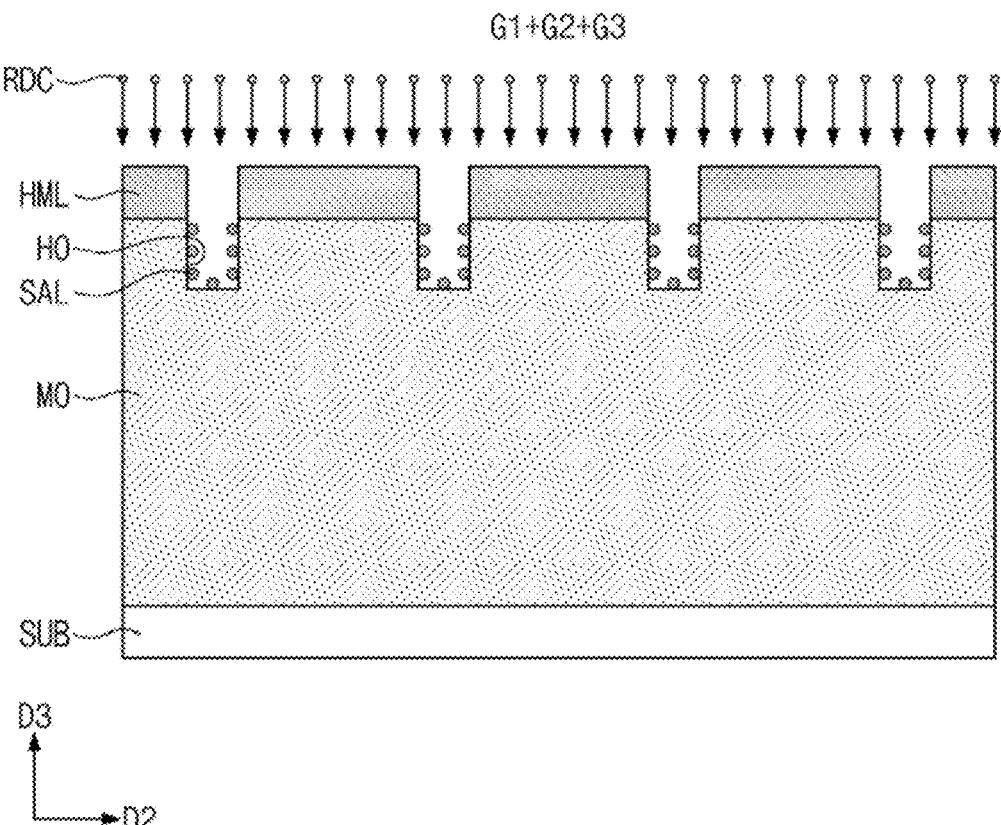
FIGS. 6, 7, and 8 illustrate cross-sectional views showing a cryogenic etching process performed on a mold layer according to some example embodiments of the present inventive concepts.
Figure 7:
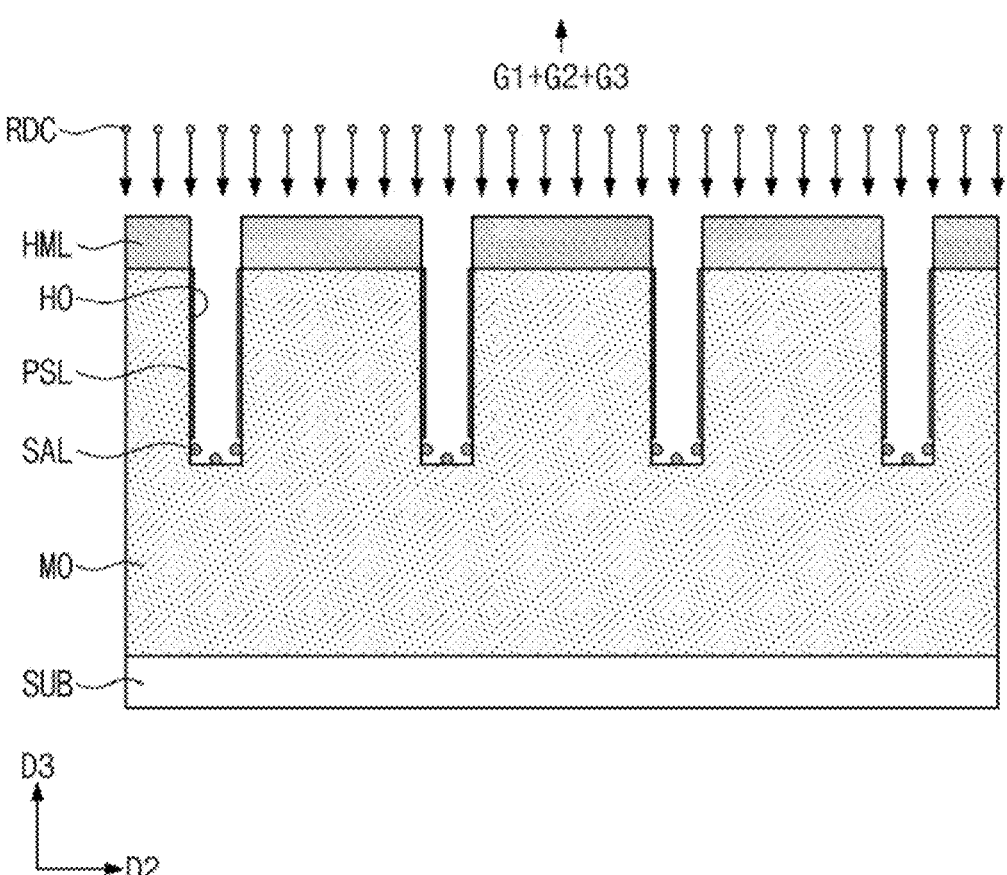
Figure 8:
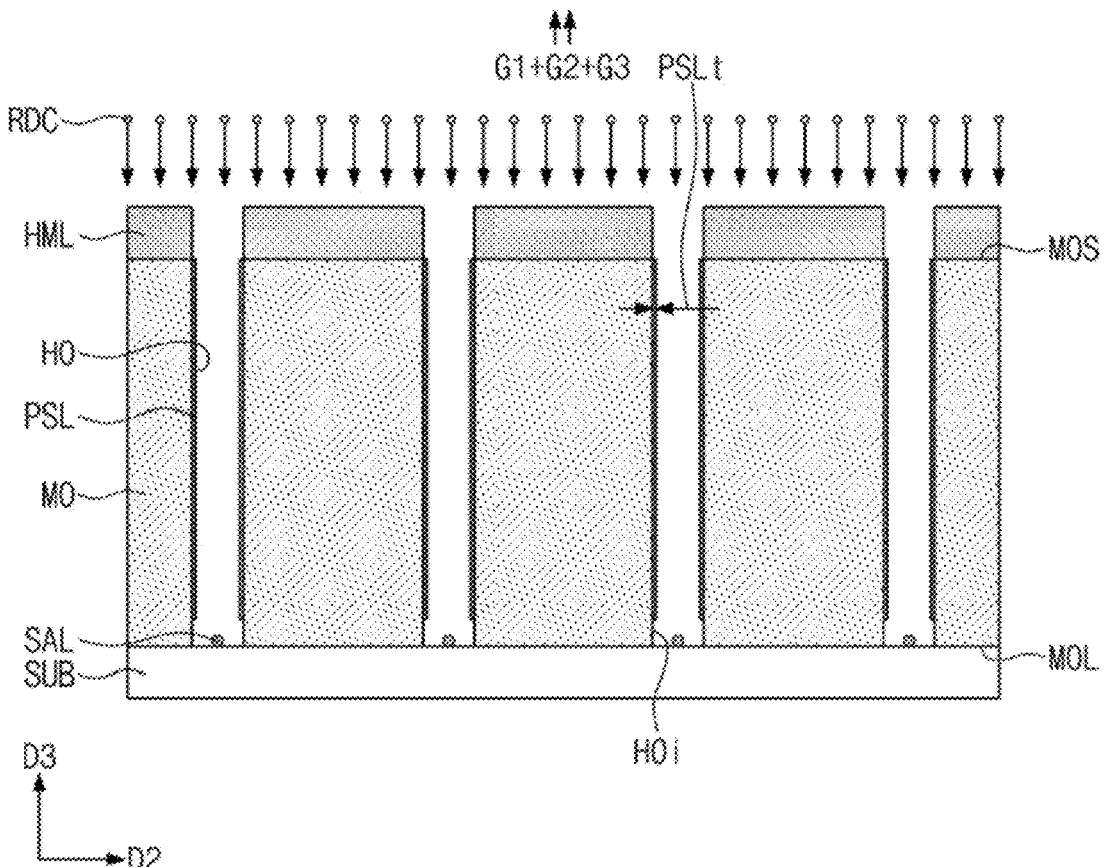

FIGS. 6, 7, and 8 illustrate cross-sectional views showing a cryogenic etching process performed on a mold layer according to some example embodiments of the present inventive concepts.

Referring to FIG. 6, a cryogenic etching process may be performed on a resultant structure of FIG. 3. The cryogenic etching process according to some example embodiments may be performed by the plasma etching apparatus 500 discussed above with reference to FIG. 2. Differently from some example embodiments, including the example embodiments shown in FIG. 4, the plasma etching apparatus 500 may further include the second gas supply source 520. For example, the second process gas G2 may be additionally used to allow a process gas G1+G2+G3 to include a mixture of the first process gas G1, the second process gas G2, and the third process gas G3.

As discussed above with reference to FIG. 4, the ammonium salt SAL may be produced in the hole HO during (e.g., based on) the etching of the mold layer MO. According to some example embodiments, as the second process gas G2 of FIG. 2 is additionally supplied, it may be possible to reduce or prevent production of the ammonium salt SAL. For example, the higher supply amount of the second process gas G2, the lower production rate of the ammonium salt SAL.

Figure 9:
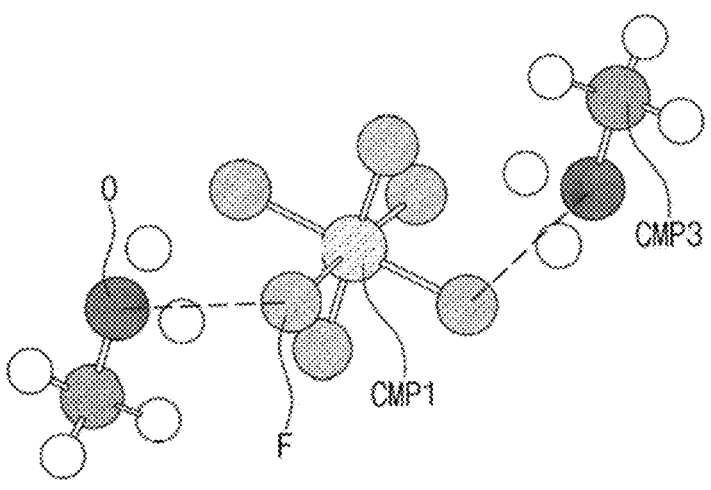
FIG. 9 illustrates a chemical structure of salt produced when using methanol as a second process gas according to some example embodiments of the present inventive concepts.

FIG. 9 illustrates a chemical structure of salt produced when using methanol as the second process gas G2 according to some example embodiments of the present inventive concepts. A salt of FIG. 9 may include a first compound CMP1, which is a fluorosilicate and a third compound CMP3 derived from methanol. The salt of FIG. 9 may have a chemical formula of $(CH_3OH_2)_2SiF_6$. An F—O bond may occur between a fluorine atom F of the first compound CMP1 and an oxygen atom O of the third compound CMP3. The F—O bond may be relatively weak. For example, as the first compound CMP1 and the third compound CMP3 are weakly bonded to each other, the compound of FIG. 9 may have an extremely unstable state. The salt of FIG. 9 may be more unstable than the ammonium salt of FIG. 5.

In a reaction that produces the compound of FIG. 9, a change (AG) in Gibbs free energy may have a relatively large value (e.g., positive value). Therefore, although the salt of FIG. 9 is produced, the salt of FIG. 9 may be re-decomposed without being maintained for a long time. In such a case, unlike the ammonium salt of FIG. 5, the salt of FIG. 9 may not maintain its stable solid state.

When the second process gas G2 is additionally introduced during the cryogenic etching process as discussed in some example embodiments, the ammonium salt of FIG. 5 and the salt of FIG. 9 may be produced competitively with each other. For example, a production amount of the ammonium salt of FIG. 5 may be reduced as large as a production amount of the salt of FIG. 9. As the salt of FIG. 9 is produced from the second process gas G2, it may be possible to reduce a production rate of the ammonium salt of FIG. 5. Although the salt of FIG. 9 is produced, the salt of FIG. 9 may be decomposed immediately and thus may not remain as the salt SAL in a solid state. Therefore, the salt of FIG. 9 may not interrupt the etching process.

As illustrated in FIG. 6, in an early etching stage where a bottom of the hole HO does not yet reach a middle level of the mold layer MO, a flow rate of the second process gas G2 may be adjusted to be small. As the second process gas G2 is adjusted to have a relatively small flow rate, it may be possible to relatively increase a production rate of the ammonium salt SAL. The ammonium salt SAL produced in the early etching stage may serve as a passivation layer PSL which will be discussed below, and thus may assist formation of the hole HO whose aspect ratio is high.

Referring to FIG. 7, a large amount of the ammonium salt SAL produced in the early etching stage (e.g., a first stage of the cryogenic etching process) may remain on an inner sidewall of the hole HO, and thus a passivation layer PSL may be formed. For example, the passivation layer PSL may include ammonium fluorosilicate of FIG. 5. As the passivation layer PSL protects the inner sidewall of the hole HO, it may be possible to reduce or prevent lateral etching in which a diameter of the hole HO is gradually increased during the cryogenic etching process, thereby preventing or reducing the potential for process defects in the fabrication of the semiconductor device, thereby resulting in the fabrication of more reliable semiconductor devices less prone to malfunction due to such defects. Therefore, an aspect ratio of the hole HO may become relatively large.

As illustrated in FIG. 8, in an intermediate etching stage (e.g., second, later stage of the cryogenic etching process)

where a bottom of the hole HO reaches a middle level of the mold layer MO, a flow rate of the second process gas G2 may be adjusted to be increased. Therefore, it may be possible to reduce a production rate of the ammonium salt SAL. This may be caused by the fact that the ammonium salt SAL produced from the intermediate etching stage may induce etching interruption, as discussed above in FIG. 4. Although the ammonium salt SAL decreases in production rate and the salt of FIG. 9 increases in production rate, the salt of FIG. 9 may be easily decomposed after being produced and thus may not remain as a solid salt.

Referring to FIG. 8, in a late etching stage (e.g., third, later stage of the cryogenic etching process) where a bottom of the hole HO approaches the substrate SUB (e.g., the lower surface MOL of the mold layer MO), a flow rate of the second process gas G2 may become further increased. Therefore, it may be possible to further reduce a production rate of the ammonium salt SAL. In the late etching stage, there may be a large reduction in etch rate of the mold layer MO, and one of causes of the reduction in etch rate may be production of the ammonium salt SAL. Therefore, it may be required to largely reduce a production rate of the ammonium salt SAL in the late etching stage. When a flow rate of the second process gas G2 is greatly increased, a production rate of the salt of FIG. 9 may be remarkably increased to significantly reduce a production rate of the ammonium salt SAL. Therefore, the etching process may be completed to allow the hole HO to stably and fully penetrate the mold layer MO.

According to a cryogenic etching process of some example embodiments, it may be possible to progressively increase a supply rate of the second process gas G2 that suppresses production of ammonium salt as the etching process proceeds. A supply rate of the second process gas G2 may be controlled by the flow controller 670 discussed above in FIG. 2.

In some example embodiments, the second process gas G2 may be supplied at a first flow rate in the early etching stage and at a second flow rate in the late etching stage. The second flow rate may be about 1.1 times to about 10 times the first flow rate. The first flow rate may be about 1 sccm to about 10 sccm, and the second flow rate may be about 10 sccm to about 100 sccm. For example, the second process gas G2 may start to be supplied at a flow rate of about 5 sccm in the early etching stage, and then may be supplied at a gradually increasing flow rate until the late etching stage in which the flow rate reaches about 50 sccm.

In some example embodiments, as the cryogenic etching process proceeds, a supply rate of the second process gas G2 may be gradually (e.g., continuously, periodically, etc.) increased over time during the cryogenic etching process and a production rate of the ammonium salt SAL may be progressively reduced. Accordingly, the passivation layer PSL formed of the ammonium salt SAL may have a thickness that decreases in a direction from upper to lower portions of the hole HO. For example, a thickness PSLt of the passivation layer PSL on the inner sidewall HOi of the hole HO may decrease in proportion with increasing distance from an upper end of the hole at the upper surface MOS of the mold layer MO.

Figure 11A:
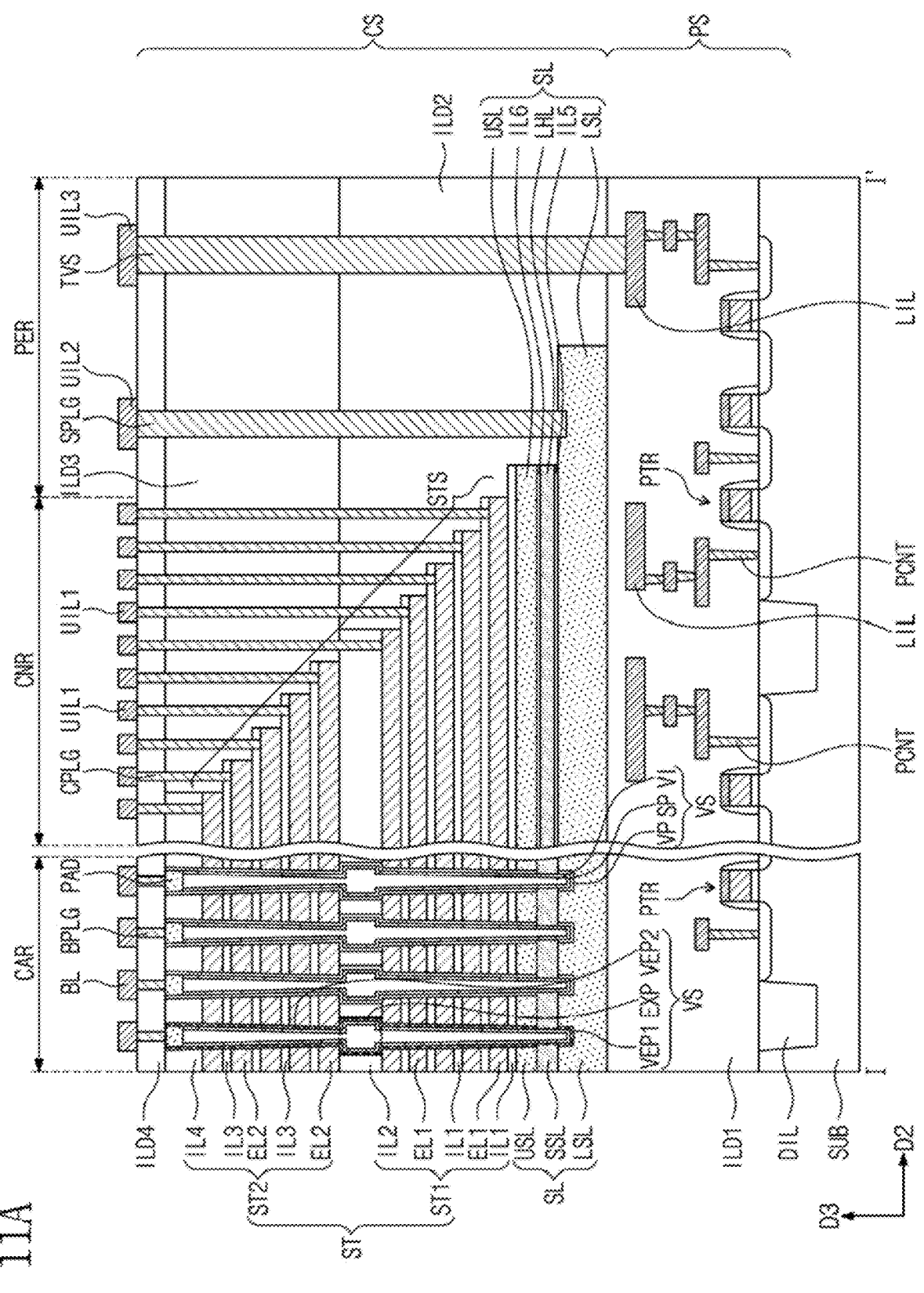
FIG. 11A illustrates a cross-sectional view taken along line I-I' of FIG. 10.
Figure 11B:
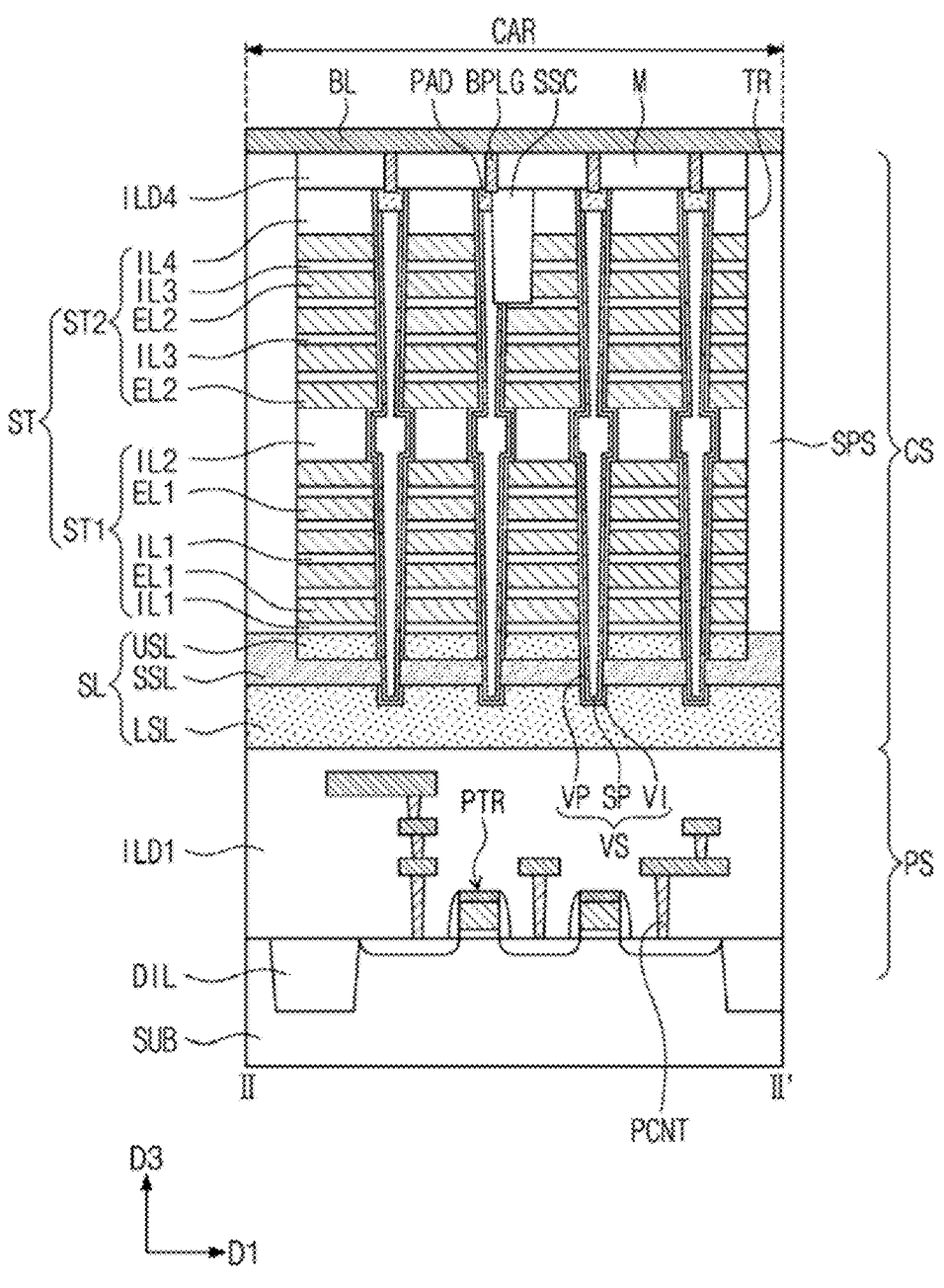
FIG. 11B illustrates a cross-sectional view taken along line II-IF of FIG. 10.

FIG. 10 illustrates a plan view showing a semiconductor device according to some example embodiments of the present inventive concepts. FIG. 11A illustrates a cross-sectional view taken along line I-I' of FIG. 10. FIG. 11B illustrates a cross-sectional view taken along line II-IF of FIG. 10.

Referring to FIGS. 10, 11A, and 11B, a first substrate SUB may be provided thereon with a low-level layer PS that includes peripheral transistors PTR. The low-level layer PS may be provided thereon with a high-level layer CS that includes a cell array structure ST.

The first substrate SUB may be a silicon substrate, a silicon-germanium substrate, a germanium substrate, or a single-crystalline epitaxial layer grown on a single-crystalline silicon substrate. The first substrate SUB may include active sections defined by a device isolation layer DIL.

The low-level layer PS may be a peripheral circuit region (or peripheral circuit layer) that includes a decoder circuit, a page buffer, and a logic circuit. The low-level layer PS may include a plurality of peripheral transistors PTR disposed on the active sections of the first substrate SUB. The peripheral transistors PTR may constitute row and column decoders, a page buffer, a control circuit, and a peripheral logic circuit.

For example, the first substrate SUB may include the active sections defined by the device isolation layer DIL. At least one peripheral transistor PTR may be provided on each of the active sections.

The low-level layer PS may further include lower lines LIL provided on the peripheral transistors PTR and a first interlayer dielectric layer ILD1 that covers the peripheral transistors PTR and the lower lines LIL. A peripheral contact PCNT may be provided between and electrically connect to the lower line LIL and the peripheral transistor PTR.

The first interlayer dielectric layer ILD1 may include a plurality of stacked dielectric layers. For example, the first interlayer dielectric layer ILD1 may include one or more of a silicon oxide layer, a silicon nitride layer, a silicon oxynitride layer, and a low-k dielectric layer. The high-level layer CS may be provided on the first interlayer dielectric layer ILD1 of the low-level layer PS. The following will describe in detail the high-level layer CS.

The high-level layer CS may include a cell array region CAR, a cell contact region CNR, and a peripheral region PER. The cell contact region CNR may be positioned between the cell array region CAR and the peripheral region PER. The peripheral region PER may be an outer area of a semiconductor chip.

A second substrate SL may be provided on the first interlayer dielectric layer ILD1. The second substrate SL may support the cell array structure ST provided on the cell array region CAR. On the cell array region CAR, the second substrate SL may include a lower semiconductor layer LSL, a source semiconductor layer SSL, and an upper semiconductor layer USL that are sequentially stacked. Each of the lower semiconductor layer LSL, the source semiconductor layer SSL, and the upper semiconductor layer USL may include at least one semiconductor material, such silicon (Si), germanium (Ge), silicon-germanium (SiGe), gallium-arsenic (GaAs), indium-gallium-arsenic (InGaAs), aluminum-gallium-arsenic (AlGaAs), or any mixture thereof.

Each of the lower semiconductor layer LSL, the source semiconductor layer SSL, and the upper semiconductor layer USL may be single-crystalline, amorphous, and/or polycrystalline. For example, each of the lower semiconductor layer LSL, the source semiconductor layer SSL, and the upper semiconductor layer USL may include a polysilicon layer into which impurities are doped to have an n-type conductivity. The lower semiconductor layer LSL, the source semiconductor layer SSL, and the upper semiconductor layer USL may have their impurity concentrations that are different from each other.

The source semiconductor layer SSL may be interposed between the lower semiconductor layer LSL and the upper semiconductor layer USL. The source semiconductor layer SSL may electrically connect the lower semiconductor layer LSL to the upper semiconductor layer USL.

On the cell contact region CNR, the second substrate SL may include a lower semiconductor layer LSL, a fifth dielectric layer IL5, a lower sacrificial layer LHL, a sixth dielectric layer IL6, and an upper semiconductor layer USL that are sequentially stacked. The fifth and sixth dielectric layers IL5 and IL6 may include a silicon oxide layer, and the lower sacrificial layer LHL may include a silicon nitride layer or a silicon oxynitride layer.

The lower semiconductor layer LSL of the second substrate SL may extend from the cell array region CAR to the peripheral region PER. The lower semiconductor layer LSL may extend to one portion of the peripheral region PER, and may not extend to another portion of the peripheral region PER. For example, the lower semiconductor layer LSL may not be provided on the another portion of the peripheral region PER.

On the cell array region CAR and the cell contact region CNR, the cell array structure ST may be provided on the second substrate SL. The cell array structure ST may include a first stack structure ST1 and a second stack structure ST2 on the first stack structure ST1. The second substrate SL may be provided thereon with a second interlayer dielectric layer ILD2 and a third interlayer dielectric layer ILD3. The second interlayer dielectric layer ILD2 may have a top surface coplanar with that of the first stack structure ST1. The third interlayer dielectric layer ILD3 may have a top surface coplanar with that of the second stack structure ST2. The second and third interlayer dielectric layers ILD2 and ILD3 may cover a stepwise structure STS of the cell array structure ST.

The first stack structure ST1 may include first electrodes EL1 that are stacked in a vertical direction (e.g., a third direction D3) to the second substrate SL. The first stack structure ST1 may further include first dielectric layers IL1 that separate the stacked first electrodes EL1 from each other. The first dielectric layers IL1 and the first electrodes EL1 of the first stack structure ST1 may be stacked alternately with each other. A second dielectric layer IL2 may be provided at top of the first stack structure ST1. The second dielectric layer IL2 may be thicker than each of the first dielectric layers IL1.

The second stack structure ST2 may include second electrodes EL2 that are stacked in the third direction D3 on the first stack structure ST1. The second stack structure ST2 may further include third dielectric layers IL3 that separate the stacked second electrodes EL2 from each other. The third dielectric layers IL3 and the second electrodes EL2 of the second stack structure ST2 may be stacked alternately with each other. A fourth dielectric layer IL4 may be provided at top of the second stack structure ST2. The fourth dielectric layer IL4 may be thicker than each of the third dielectric layers IL3.

The cell array structure ST may include the stepwise structure STS on the cell contact region CNR. The stepwise structure STS may be a portion of the cell array structure ST, which portion extends from the cell array region CAR to the cell contact region CNR. For example, the first and second electrodes EL1 and EL2 of the cell array structure ST may extend from the cell array region CAR to the cell contact region CNR, thereby constituting the stepwise structure STS.

The stepwise structure STS on the cell contact region CNR may be connected to the cell array structure ST on the cell array region CAR. The stepwise structure STS may have a height that deceases with deceasing distance from the peripheral region PER. For example, the height of the stepwise structure STS may decrease in a second direction D2.

A first lower selection line may be defined to indicate a lowermost one of the first electrodes EL1 in the cell array structure ST, and a second lower selection line may be defined to indicate the first electrode EL1 on the lowermost first electrode EL1.

A first string selection line may be defined to indicate an uppermost one of the second electrodes EL2 in the cell array structure ST, and a second string selection line may be defined to indicate the second electrode EL2 on the uppermost second electrode EL2. Word lines may be defined to indicate the first and second electrodes EL1 and EL2 other than the first and second lower selection lines and the first and second string selection lines.

The first and second electrodes EL1 and EL2 may have their one ends that constitute the stepwise structure STS. The one ends of the first and second electrodes EL1 and EL2 may be sequentially exposed through the stepwise structure STS.

The first and second electrodes EL1 and EL2 may include a conductive material that is at least one of one or more doped semiconductors (e.g., doped silicon), one or more metals (e.g., tungsten, copper, or aluminum), one or more conductive metal nitrides (e.g., titanium nitride or tantalum nitride), or one or more transition metals (e.g., titanium or tantalum). The first to fourth dielectric layers IL1 to IL4 may include a silicon oxide layer.

On the cell array region CAR, a plurality of vertical channel structures VS that penetrate the cell array structure ST. Each of the vertical channel structures VS may include a vertical dielectric pattern VP, a vertical semiconductor pattern SP, and a buried dielectric pattern VI. The vertical semiconductor pattern SP may be interposed between the vertical dielectric pattern VP and the buried dielectric pattern VI. A conductive pad PAD may be provided on an upper portion of each of the vertical channel structures VS.

The buried dielectric pattern VI may have cylindrical shape. The vertical semiconductor pattern SP may cover a surface of the buried dielectric pattern VI and may extend in the third direction D3 from the lower semiconductor layer LSL to the conductive pad PAD. The vertical semiconductor pattern SP may have a pipe shape whose top end is opened.

The vertical dielectric pattern VP may cover an outer surface of the vertical semiconductor pattern SP and may extend in the third direction D3 from the lower semiconductor layer LSL to a top surface of a fourth interlayer dielectric layer ILD4 which will be discussed below. The vertical dielectric pattern VP may have a pipe shape whose top end is opened. The vertical dielectric pattern VP may be interposed between the cell array structure ST and the vertical semiconductor pattern SP.

The vertical dielectric pattern VP may be formed of a single thin layer or a plurality of thin layers. In some example embodiments of the present inventive concepts, the vertical dielectric pattern VP may include a data storage layer. In some example embodiments of the present inventive concepts, the vertical dielectric pattern VP may include a tunnel dielectric layer, a charge storage layer, and a blocking dielectric layer that are collectively used as a data storage layer of an NAND Flash memory device.

For example, the charge storage layer may be a trap dielectric layer, a floating gate electrode, or a dielectric layer including conductive nano-dots. The charge storage layer may include at least one of a silicon nitride layer, a silicon oxynitride layer, a silicon-rich nitride layer, a nano-crystalline silicon layer, or a laminated trap layer. Each of the tunnel dielectric layer and the blocking dielectric layer may include a silicon oxide layer.

The vertical semiconductor pattern SP may include a semiconductor material, such as silicon (Si), germanium (Ge), or any mixture thereof. Additionally or alternatively, the vertical semiconductor pattern SP may include an impurity-doped semiconductor or an impurity-undoped intrinsic semiconductor. The vertical semiconductor pattern SP including a semiconductor material may be used as a channel of transistors included in a memory cell string.

The conductive pad PAD may cover a top surface of the vertical semiconductor pattern SP and a top surface of the buried dielectric pattern VI. The conductive pad PAD may include one or more of an impurity-doped semiconductor material and a conductive material. A bit-line contact BPLG may be electrically connected through the conductive pad PAD to the vertical semiconductor pattern SP.

The source semiconductor layer SSL may be in direct contact with a lower sidewall of each of the vertical semiconductor patterns SP. The source semiconductor layer SSL may electrically connect a plurality of vertical semiconductor patterns SP to each other. For example, the vertical semiconductor patterns SP may be electrically connected together to the second substrate SL. The second substrate SL may serve as a source of memory cells. The second substrate SL may be provided with a common source voltage through a source contact plug SPLG which will be discussed below.

Each of the vertical channel structures VS may include a first vertical extension VEP1 that penetrates the first stack structure ST1, a second vertical extension VEP2 that penetrates the second stack structure ST2, and an expansion EXP between the first and second vertical extensions VEP1 and VEP2. The expansion EXP may be provided in the second dielectric layer IL2.

The first vertical extension VEP1 may have a diameter that increases in a direction from lower to upper portions thereof. The second vertical extension VEP2 may have a diameter that increases in a direction from lower to upper portions thereof. The expansion EXP may have a diameter greater than a maximum diameter of each of the first and second vertical extensions VEP1 and VEP2.

A plurality of separation structures SPS may penetrate the cell array structure ST (see FIG. 11B). The separation structures SPS may horizontally separate the cell array structure ST into a plurality of structures. For example, the separation structures SPS may horizontally separate one electrode EL1 or EL2 of the cell array structure ST into a plurality of electrodes. The separation structures SPS may include a dielectric material, such as silicon oxide.

A fourth interlayer dielectric layer ILD4 may be provided on the cell array structure ST and the third interlayer dielectric layer ILD3. A plurality of bit-line contacts BPLG may penetrate the fourth interlayer dielectric layer ILD4 to be coupled to corresponding conductive pads PAD. A plurality of bit lines BL may be disposed on the fourth interlayer dielectric layer ILD4. The bit lines BL may parallel extend in the first direction D1. The bit line BL may be electrically connected through bit-line contacts BPLG to corresponding vertical channel structure VS.

On the cell contact region CNR, a plurality of first upper lines UIL1 may be provided on the fourth interlayer dielectric layer ILD4. A plurality of cell contact plugs CPLG may be provided to vertically extend from the first upper lines UIL1 to the stepwise structure STS.

The cell contact plugs CPLG may be correspondingly coupled to the first and second electrodes EL1 and EL2 that are exposed on the stepwise structure STS. The cell contact plugs CPLG may be sequentially coupled to corresponding ends of the first and second electrodes EL1 and EL2. The first and second electrodes EL1 and EL2 may be electrically connected through the cell contact plugs CPLG to the first upper lines UIL1.

On the peripheral region PER, a second upper line UIL2 may be provided on the fourth interlayer dielectric layer ILD4. A source contact plug SPLG may be provided to vertically extend from the second upper line UIL2 to the lower semiconductor layer LSL. The second upper line UIL2 may be electrically connected through the source contact plug SPLG to the second substrate SL. A common source voltage may be applied from the second upper line UIL2 through the source contact plug SPLG to the second substrate SL.

On the peripheral region PER, a third upper line UIL3 may be provided on the fourth interlayer dielectric layer ILD4. A through via TVS may be provided to vertically extend from the third upper line UIL3 to the lower line LIL of the low-level layer PS. The high-level layer CS may be electrically connected via the through via TVS to the low-level layer PS.

Referring back to FIGS. 10 and 11B, a cutting structure SSC may be provided on the cell array region CAR. The cutting structure SSC may extend in the second direction D2 while running across an upper portion of the cell array structure ST. The cutting structure SSC may have a linear shape when viewed in plan.

The vertical channel structures VS may be two-dimensionally arranged to form first to eighth rows RO1 to RO8. The first to eighth rows RO1 to RO8 may be arranged at a regular interval along the first direction D1. The vertical channel structures VS in each of the first to eighth rows RO1 to RO8 may be arranged at a regular pitch along the second direction D2.

The vertical channel structures VS in neighboring rows may be offset from each other in the second direction D2. For example, the vertical channel structures VS in the first row RO1 may be offset in the second direction D2 from the vertical channel structures VS in the second row RO2.

The cutting structure SSC may be provided between the fourth row RO4 and the fifth row RO5, while extending in the second direction D2. The cutting structure SSC may vertically overlap at least a portion of each of the vertical channel structures VS in the fourth and fifth rows RO4 and RO5. For example, the cutting structure SSC may extend while running across the vertical channel structures VS in the fourth and fifth rows RO4 and RO5.

The cutting structure SSC may penetrate the uppermost second electrode EL2 or the first string selection line (see UL1 of FIG. 4), and may also penetrate the second electrode EL2, or the second string selection line, below the uppermost second electrode EL2. The cutting structure SSC may separate the first string selection line into two lines. The cutting structure SSC may separate the second string selection line into two lines. The cutting structure SSC may penetrate a portion of the conductive pad PAD. The cutting structure SSC may partially penetrate an upper portion of the vertical channel structure VS.

FIGS. 12A, 13A, 14A, 15A, 16A, 17A, 18A, and 19A illustrate cross-sectional views taken along line I-I' of FIG. 10, showing a method of fabricating a semiconductor device according to some example embodiments of the present inventive concepts. FIGS. 12B, 13B, 14B, 15B, 16B, 17B, 18B, and 19B illustrate cross-sectional views taken along line II-II' of FIG. 10, showing a method of fabricating a semiconductor device according to some example embodiments of the present inventive concepts.

Figure 12A:
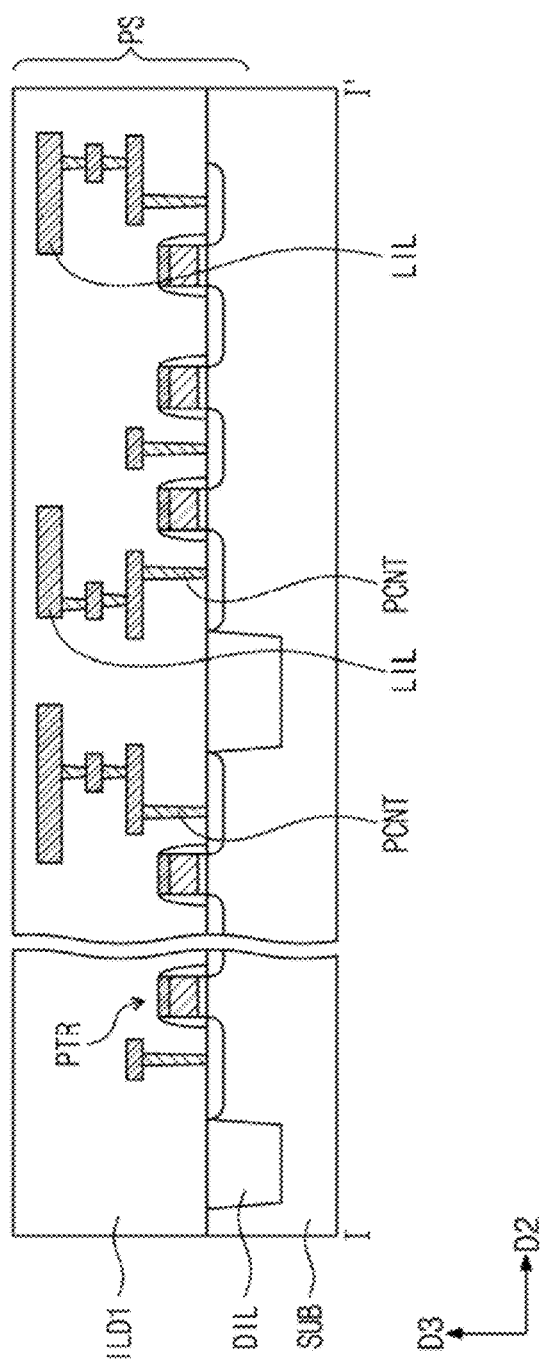
FIGS. 12A, 13A, 14A, 15A, 16A, 17A, 18A, and 19A illustrate cross-sectional views taken along line I-I' of FIG.
Figure 12B:
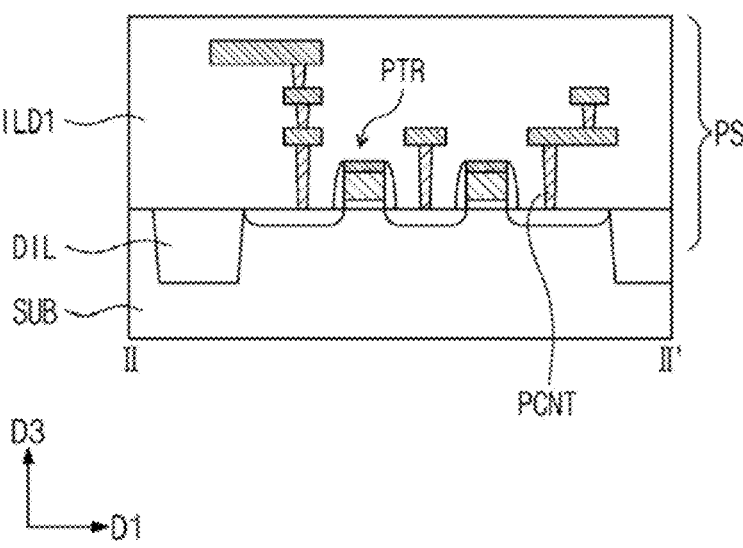

Referring to FIGS. 10, 12A, and 12B, a low-level layer PS may be formed on a first substrate SUB. The formation of the low-level layer PS may include forming peripheral transistors PTR on the first substrate SUB, and forming lower lines LIL on the peripheral transistors PTR. For example, the formation of the peripheral transistors PTR may include forming on the first substrate SUB a device isolation layer DIL that defines active sections, forming a gate dielectric layer and a gate electrode on the active sections, and implanting the active sections with impurities to form source/drain areas. A first interlayer dielectric layer ILD1 may be formed to cover the peripheral transistors PTR and the lower lines LIL.

Figure 13A:
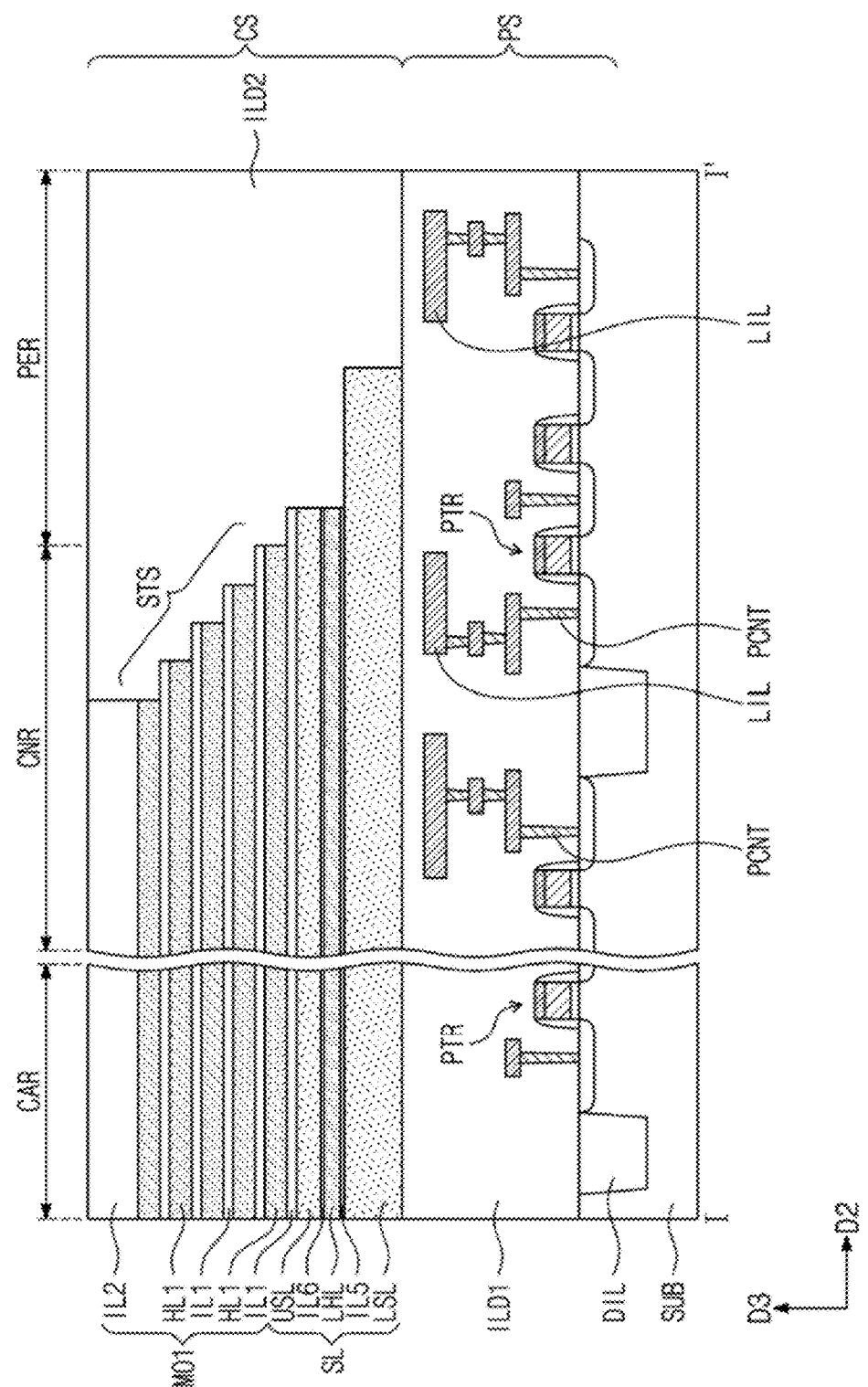
Figure 13B:
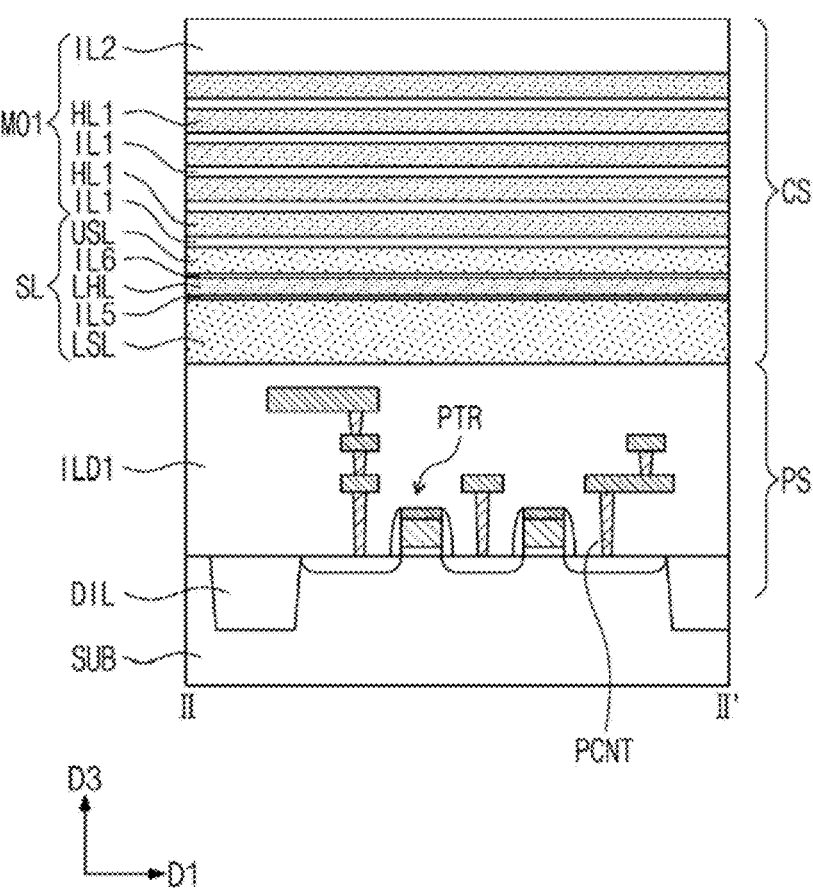

Referring to FIGS. 10, 13A, and 13B, a high-level layer CS may be formed, on the first interlayer dielectric layer ILD1, to include a cell array region CAR, a cell contact region CNR, and a peripheral region PER. For example, a second substrate SL may be formed on the first interlayer dielectric layer ILD1. The formation of the second substrate SL may include sequentially forming a lower semiconductor layer LSL, a fifth dielectric layer IL5, a lower sacrificial layer LHL, a sixth dielectric layer IL6, and an upper semiconductor layer USL.

For example, the lower semiconductor layer LSL and the upper semiconductor layer USL may include a semiconductor material, such as polysilicon. The fifth and sixth dielectric layers IL5 and IL6 may include a silicon oxide layer, and the lower sacrificial layer LHL may include a silicon nitride layer or a silicon oxynitride layer.

A first mold layer MO1 may be formed on the second substrate SL. For example, the first mold layer MO1 may be formed by alternately stacking first dielectric layers IL1 and first sacrificial layers HL1 on the upper semiconductor layer USL. A second dielectric layer IL2 may be formed at top of the first mold layer MO1.

The first dielectric layers ILL the first sacrificial layers HL1, and the second dielectric layer IL2 may be deposited by using thermal chemical vapor deposition (CVD), plasma enhanced CVD, physical CVD, or atomic layer deposition (ALD). The first dielectric layers IL1 and the second dielectric layer IL2 may include a silicon oxide layer, and the first sacrificial layers HL1 may include a silicon nitride layer or a silicon oxynitride layer.

On the cell contact region CNR, a stepwise structure STS may be formed on the first mold layer MO1. For example, the first mold layer MO1 may undergo a cycle process to form the stepwise structure STS on the cell contact region CNR. The formation of the stepwise structure STS may include forming a mask pattern (not shown) on the first mold layer MO1, and repeatedly performing a cycle process that uses the mask pattern. A single cycle process may include an etching process in which the mask pattern is used as an etching mask to etch a portion of the first mold layer MO1, and a trimming process in which the mask pattern is reduced.

A second interlayer dielectric layer ILD2 may be formed on the first mold layer MO1. The formation of the second interlayer dielectric layer ILD2 may include forming a dielectric layer that covers the first mold layer MO1, and performing a planarization process on the dielectric layer until the second dielectric layer IL2 is exposed.

Figure 14A:
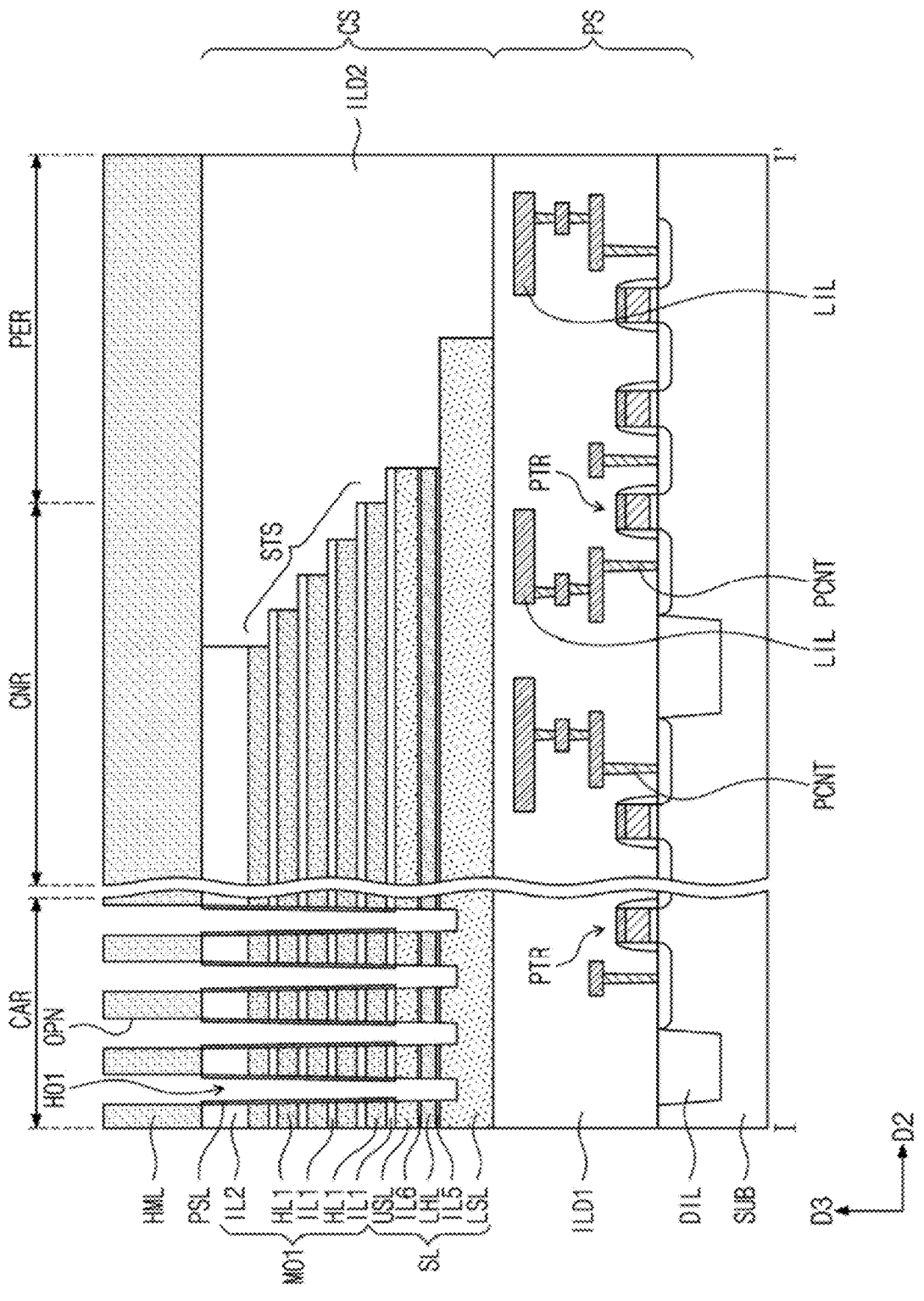
Figure 14B:
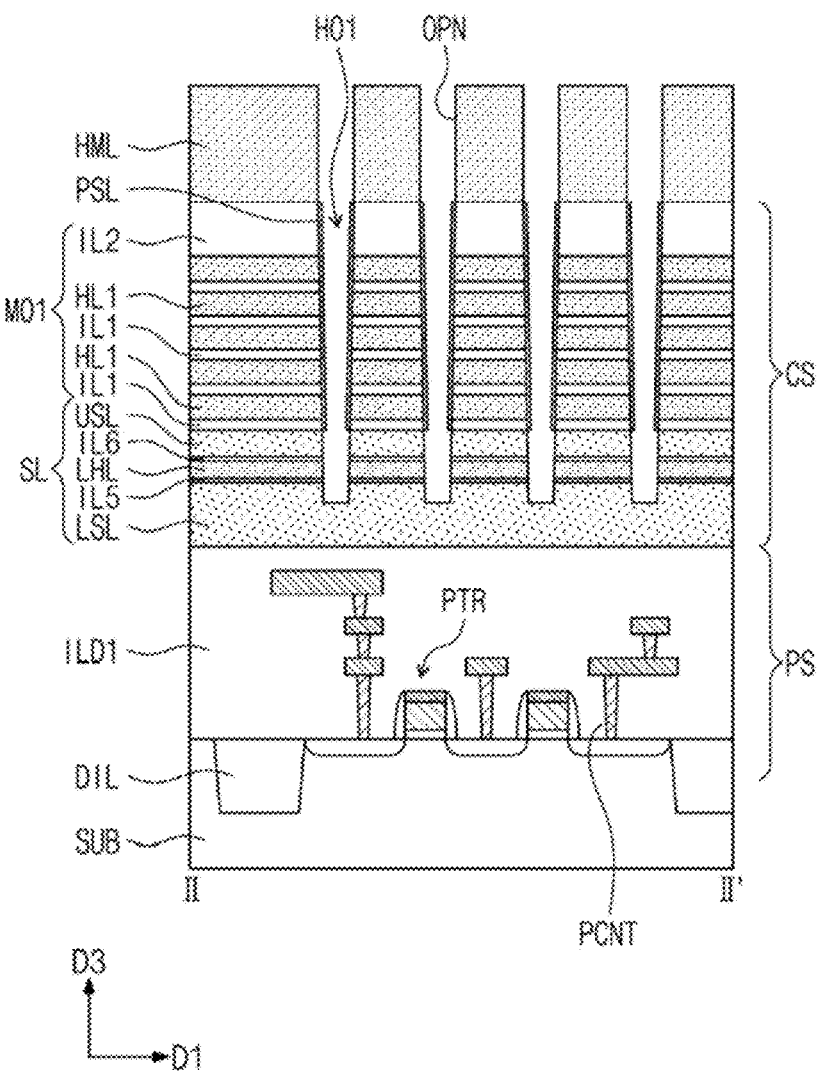

Referring to FIGS. 10, 14A, and 14B, a hardmask layer HML may be formed on the first mold layer MO1 and the second interlayer dielectric layer ILD2. The hardmask layer HML may be the same as the hardmask layer HML discussed above with reference to FIG. 3. For example, the hardmask layer HML may include an amorphous carbon layer.

A photolithography process may be employed to pattern the hardmask layer HML. A plurality of openings OPN may be formed in the hardmask layer HML. According to some example embodiments of the present inventive concepts, the photolithography process may be a lithography process that uses an extreme ultraviolet (EUV) radiation. In this description, the EUV may mean an ultraviolet ray having a wavelength of about 4 nm to about 124 nm, narrowly about 4 nm to about 20 nm, and more narrowly about 13.5 nm. The EUV may denote light whose energy is in a range of about 6.21 eV to about 124 eV, for example, of about 90 eV to about 95 eV.

The lithography process that uses the EUV may include exposure and development processes that use the EUV irradiated onto a photoresist layer. For example, the photoresist layer may be an organic photoresist that contains an organic polymer such as polyhydroxystyrene. The organic photoresist may further include a photosensitive compound that is sensitive to the EUV.

The organic photoresist may additionally include a material whose EUV absorption coefficient is high, for example, an organometallic material, an iodine-containing material, or a fluorine-containing material. For another example, the photoresist layer may be an inorganic photoresist that contains an inorganic material, such as tin oxide.

The photoresist layer may be formed to have a relatively small thickness. The photoresist layer exposed to the EUV may be developed to form photoresist patterns. When viewed in plan, the photoresist patterns may have a linear shape that extends in one direction, an island shape, a zigzag shape, a honeycomb shape, or a circular shape, but the present inventive concepts are not limited to a particular example. According to the present inventive concept, the photoresist patterns may be used as an etching mask such that the hardmask layer HML may be patterned to form the openings OPN.

As a comparative example, a multi-patterning technique (MPT) requires the use of two or more photomasks to form fine-pitched patterns on a wafer. In contrast, when the EUV lithography process is performed according to some example embodiments of the present inventive concepts, only a single photomask may be enough to form fine-pitched patterns.

A value equal to or less than about 45 nm may be given as a minimum pitch between the openings OPN achieved by the EUV lithography process according to some example embodiments. Hence, as the EUV lithography process is performed, precise and minute openings OPN may be implemented without requiring the multi-patterning technique.

The hardmask layer HML may be used as an etching mask to anisotropically etch the first mold layer MO1 to form first holes HO1. The first holes HO1 may penetrate the first mold layer MO1 on the cell array region CAR. Each of the first holes HO1 may expose the lower semiconductor layer LSL.

The anisotropic etching process for forming the first holes HO1 may include the cryogenic etching process discussed with reference to FIGS. 6 to 8 according to some example embodiments of the present inventive concepts. The anisotropic etching process for forming the first holes HO1 may be performed by using the plasma etching apparatus 500 of FIG. 2.

As discussed with reference to FIG. 7, a passivation layer PSL formed of ammonium salt may be produced on an inner sidewall of the first hole HO1. The passivation layer PSL may reduce or prevent horizontal etching, and thus the first hole HO1 may be inhibited from an increase in diameter thereof. The passivation layer PSL may not be produced in a lower portion of the first hole HO1. This may be caused by the fact that a supply rate of the second process gas G2 is sufficiently enough to significantly reduce a production rate of ammonium salt. When a temperature of the first substrate SUB is increased back to room temperature after the cryogenic etching process, the passivation layer PSL in the first hole HO1 may all be decomposed and removed.

According to the present inventive concepts, as discussed with reference to FIGS. 6 to 8, because the anisotropic etching process is the cryogenic etching process, it may be possible to obtain a high aspect ratio and a high etch selectivity with respect to the first mold layer MO1. In addition, the use of the second process gas G2 that suppresses production of ammonium salt may reduce or prevent process failure such as etching interruption caused by ammonium salt, which may otherwise result in process defects in the semiconductor device fabricated based on the cryogenic etching process being performed on the mold layer MO, thereby the reduction or prevention in process failures may result in fabrication of semiconductor devices having fewer or no process defects and thus having improved reliability, performance, or the like. In conclusion, the cryogenic etching process according to the present inventive concepts, a plasma etching apparatus configured to perform the cryogenic etching process according to the present inventive concepts, and a process gas for the cryogenic etching process which includes the aforementioned first and second process gases, may provide a semiconductor device that is fabricated based on the cryogenic etching process with reduced or no defects due to process failures that may otherwise occur due to ammonium salt production during the cryogenic etching process, thereby providing a semiconductor device with increased reliability.

Figure 15A:
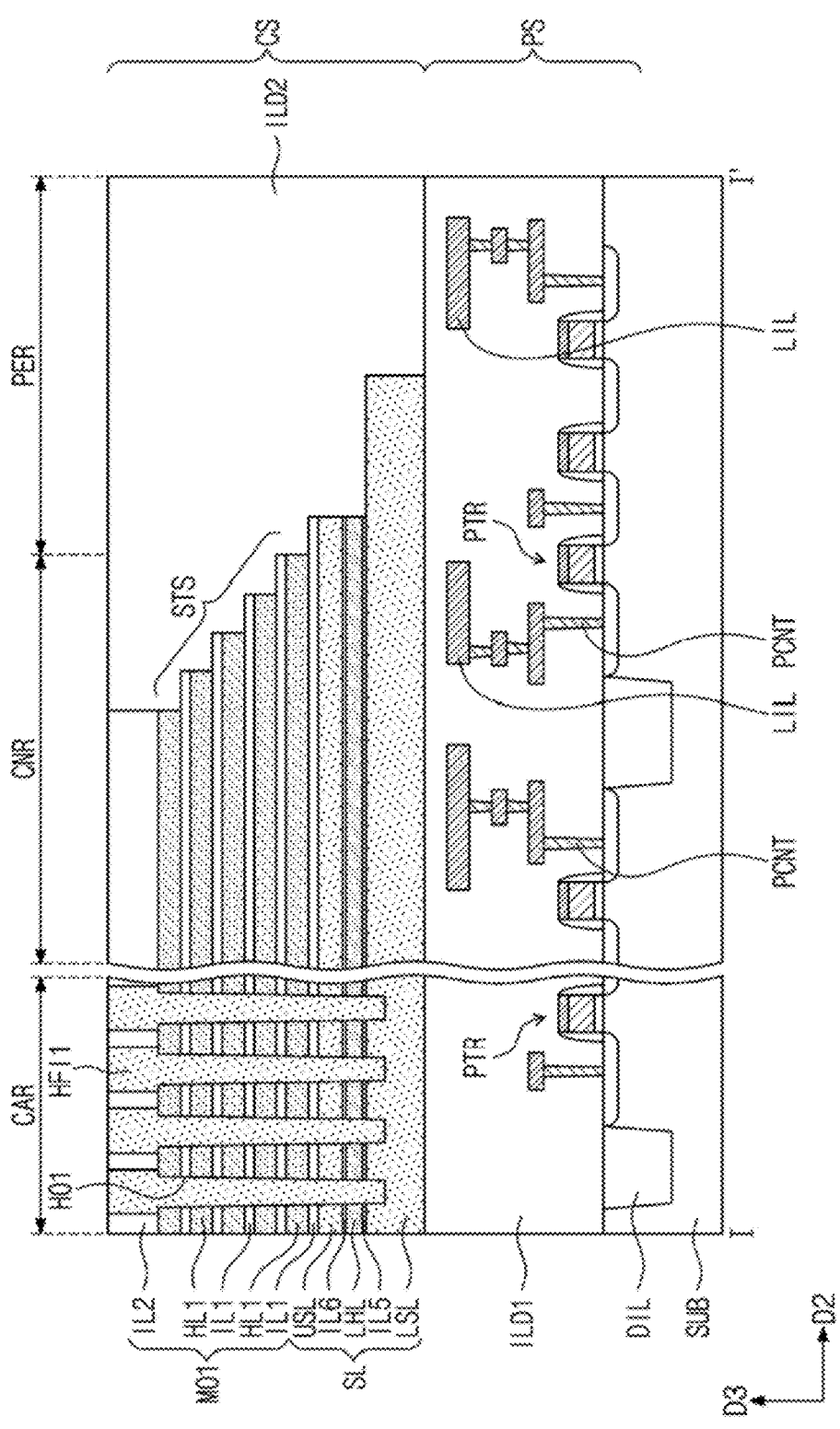
Figure 15B:
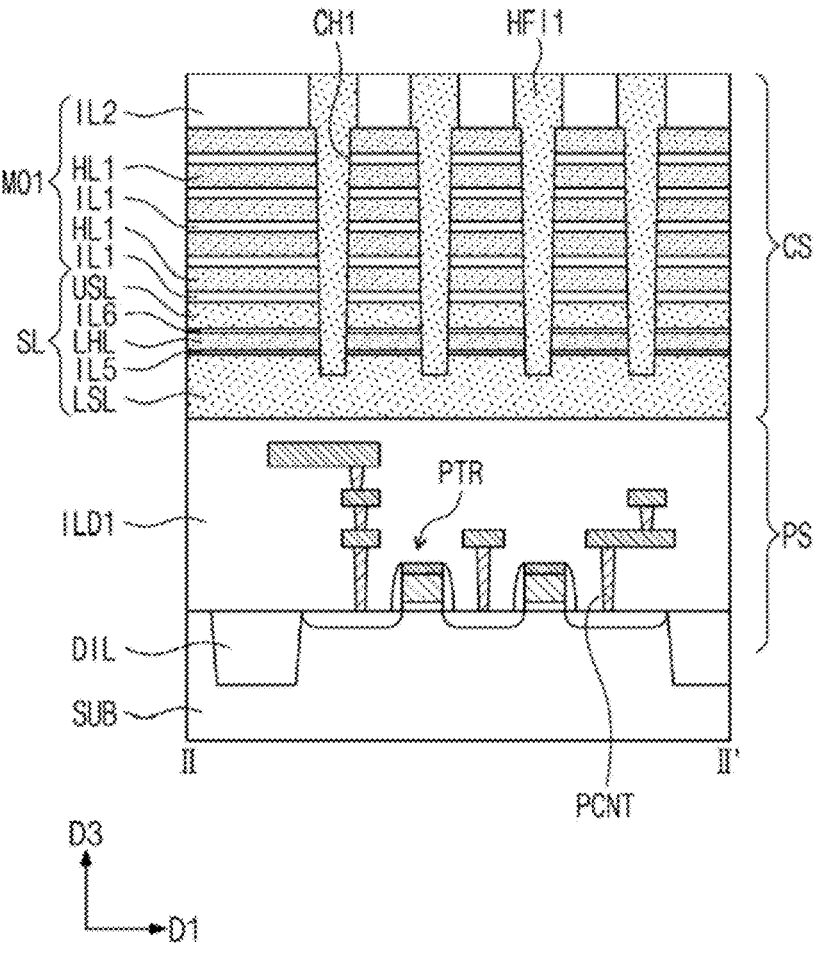

Referring to FIGS. 10, 15A, and 15B, the hardmask layer HML may be selectively removed. Each of the first holes HO1 may be expanded at an upper portion thereof. Therefore, there may be an abrupt in diameter of the first hole HO1. First sacrificial pillars HFI1 may be formed to fill corresponding first holes HO1.

For example, the formation of the first sacrificial pillars HFI1 may include forming a first sacrificial mask layer to fill the first holes HO1, and then planarizing the first sacrificial mask layer until a top surface of the second dielectric layer IL2 is exposed. The first sacrificial pillar HFI1 may have a top surface coplanar with that of the second dielectric layer IL2. For example, the first sacrificial mask layer may include polysilicon.

Figure 16A:
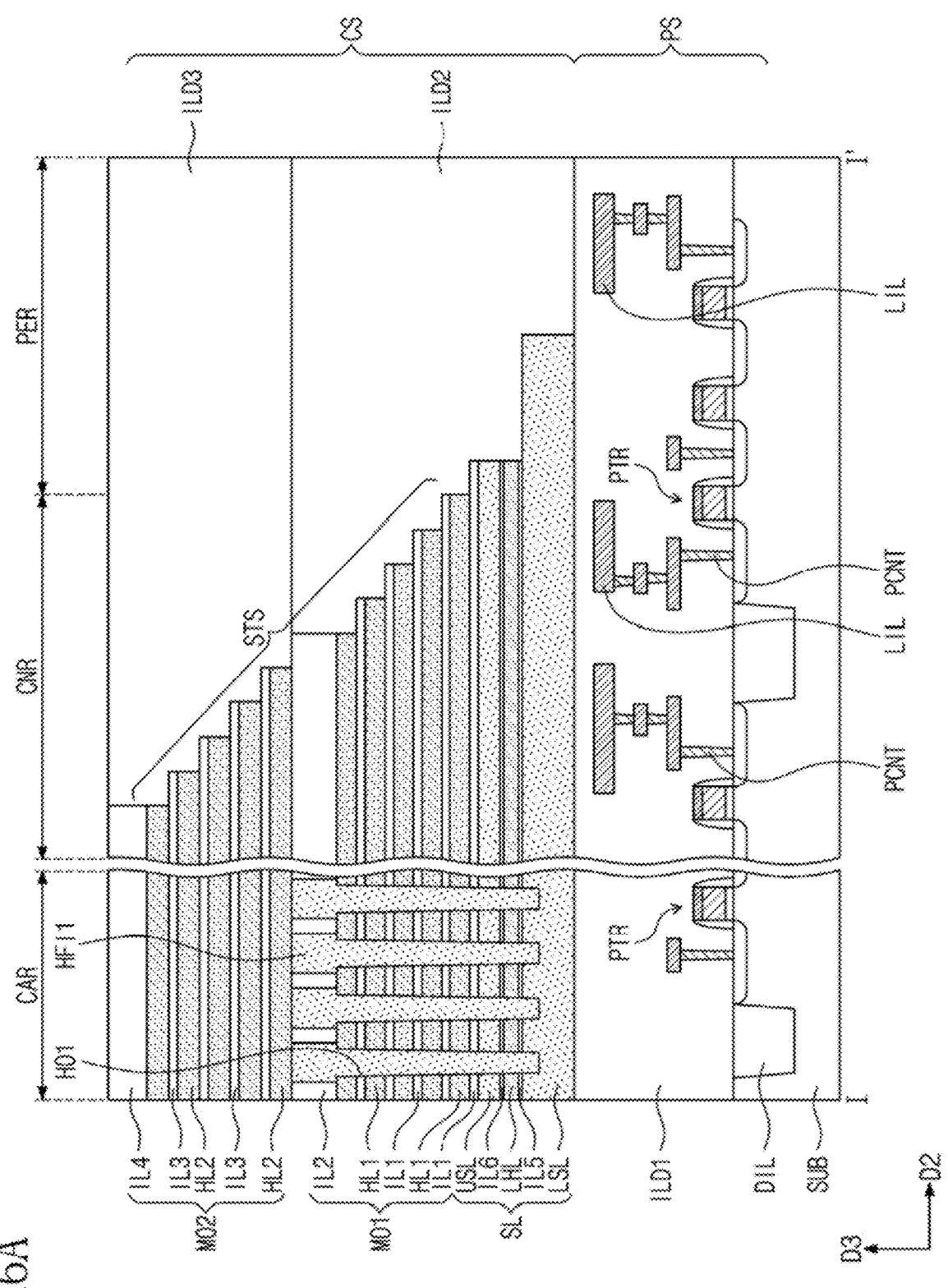
Figure 16B:
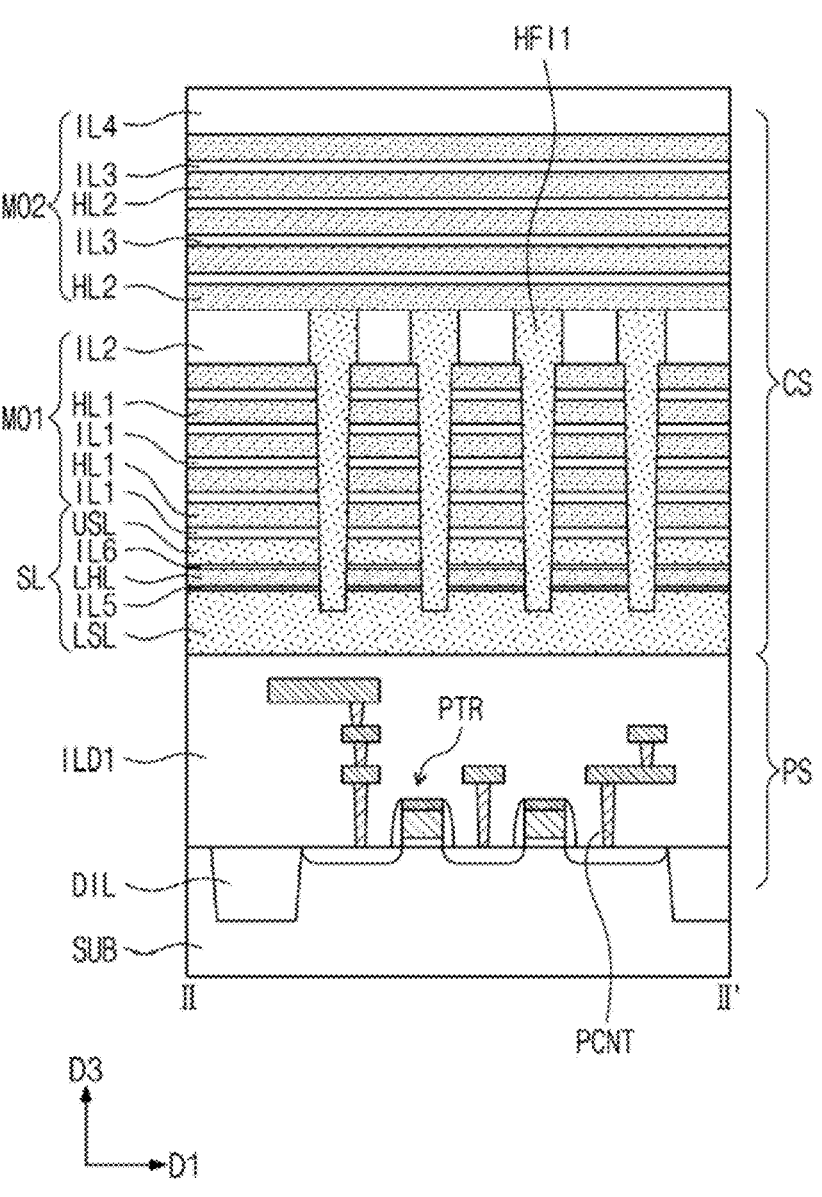

Referring to FIGS. 10, 16A, and 16B, on the cell array region CAR, a second mold layer MO2 may be formed on the first mold layer MO1. The formation of the second mold layer MO2 may include alternately stacking third dielectric layers IL3 and second sacrificial layers HL2 on the first mold layer MO1, and forming a stepwise structure STS by performing a cycle process on a stack structure in which the third dielectric layers IL3 and the second sacrificial layers HL2 are alternately stacked with each other. The cycle process may be the same as the formation of the stepwise structure STS of the first mold layer MO1 discussed above. The second mold layer MO2 on the cell contact region CNR may have the stepwise structure STS. The stepwise structure STS of the second mold layer MO2 may be connected to the stepwise structure STS of the first mold layer MO1.

A fourth dielectric layer IL4 may be formed at top of the second mold layer MO2. The third dielectric layers IL3 and the fourth dielectric layer IL4 may include a silicon oxide layer, and the second sacrificial layers HL2 may include a silicon nitride layer or a silicon oxynitride layer. The second sacrificial layers HL2 may include the same material as that of the first sacrificial layers HL1.

A third interlayer dielectric layer ILD3 may be formed on the second mold layer MO2. The formation of the third interlayer dielectric layer ILD3 may include forming a dielectric layer that covers the second mold layer MO2, and performing a planarization process on the dielectric layer until the fourth dielectric layer IL4 is exposed. The third interlayer dielectric layer ILD3 may cover the stepwise structure STS of the second mold layer MO2.

Figure 17A:
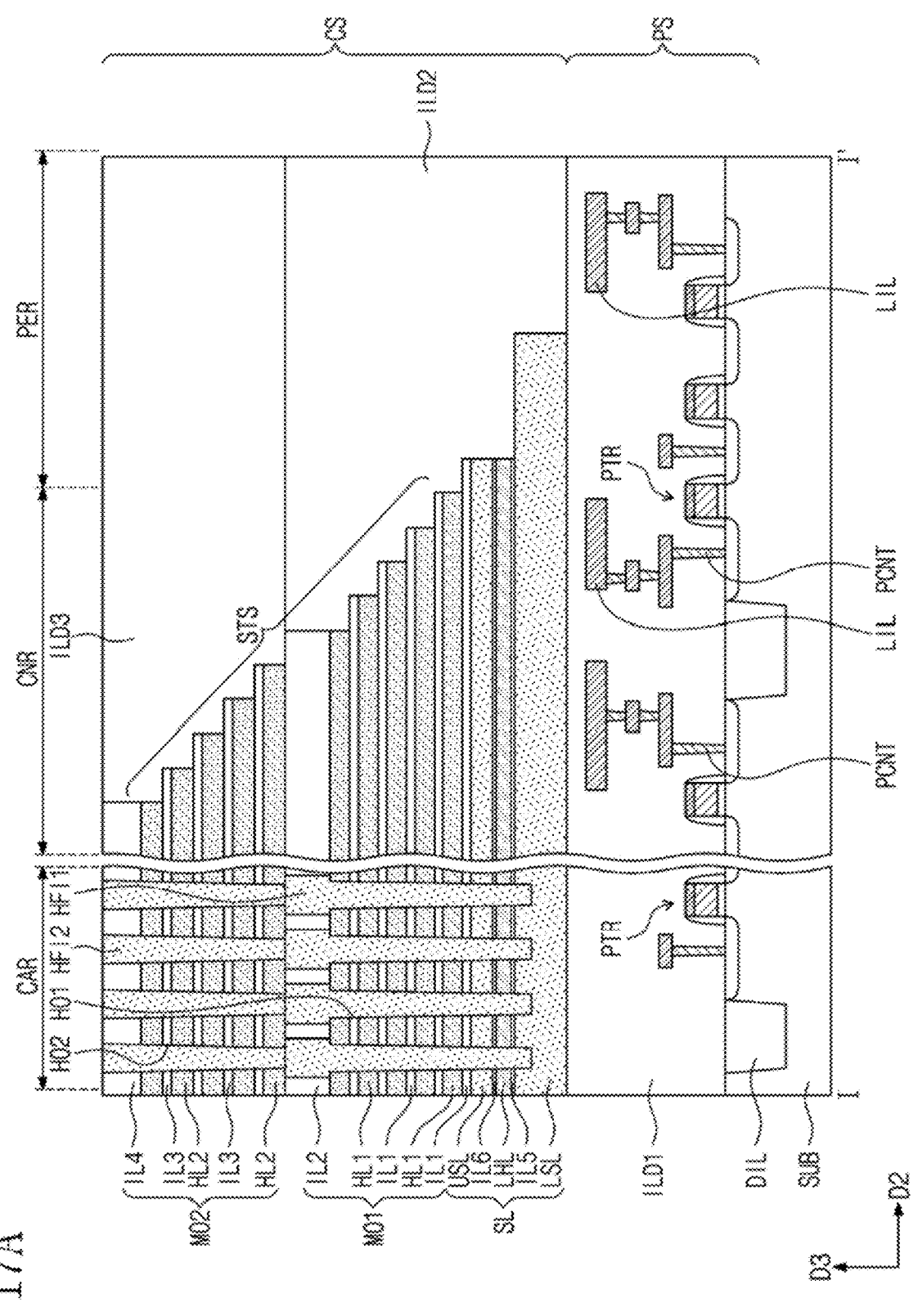
Figure 17B:
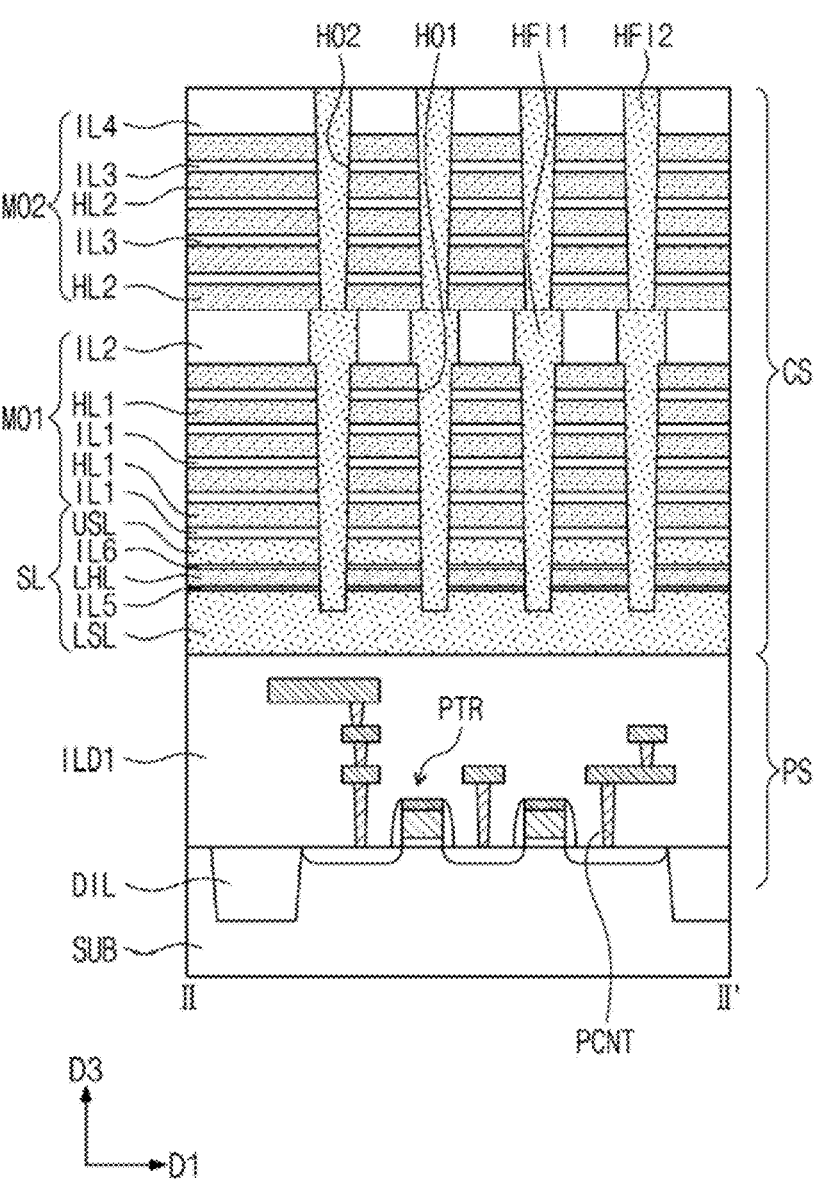

Referring to FIGS. 10, 17A, and 17B, on the cell array region CAR, second holes HO2 may be formed to penetrate the second mold layer MO2. The second holes HO2 may be formed to vertically overlap corresponding first sacrificial pillars HFI1. The second holes HO2 may be formed by using the cryogenic etching process performed on the mold layer discussed above with reference to FIGS. 6 to 8.

Second sacrificial pillars HFI2 may be formed to fill corresponding second holes HO2. The second sacrificial pillars HFI2 may vertically overlap corresponding first sacrificial pillars HFI1. For example, the formation of the second sacrificial pillars HFI2 may include forming a second sacrificial mask layer that fills the second holes HO2, and then performing a planarization process on the second sacrificial mask layer until a top surface of the fourth dielectric layer IL4 is exposed. For example, the second sacrificial mask layer may include polysilicon. The second sacrificial pillars HFI2 may include the same material as that of the first sacrificial pillars HFI1.

Figure 18A:
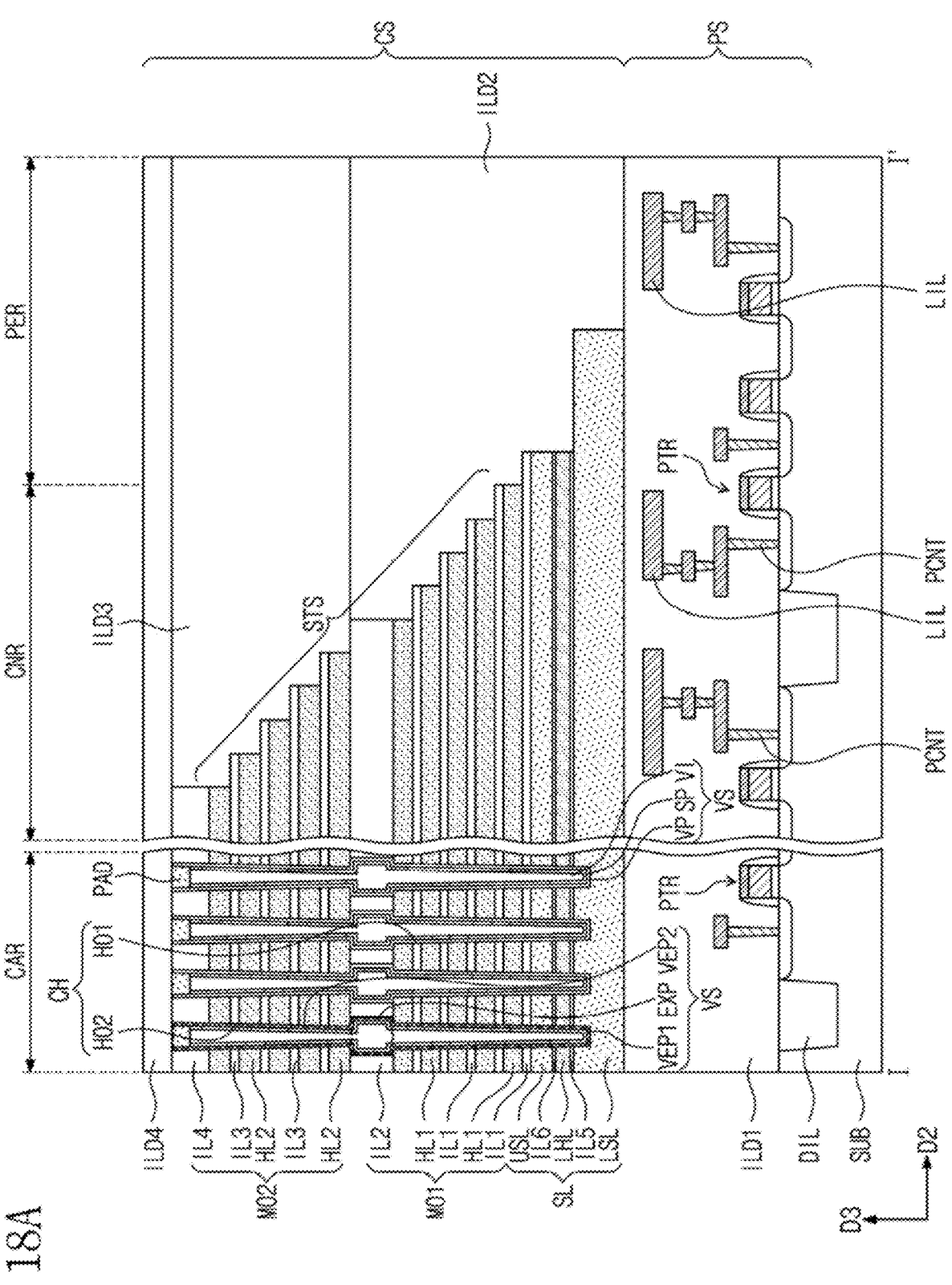
Figure 18B:
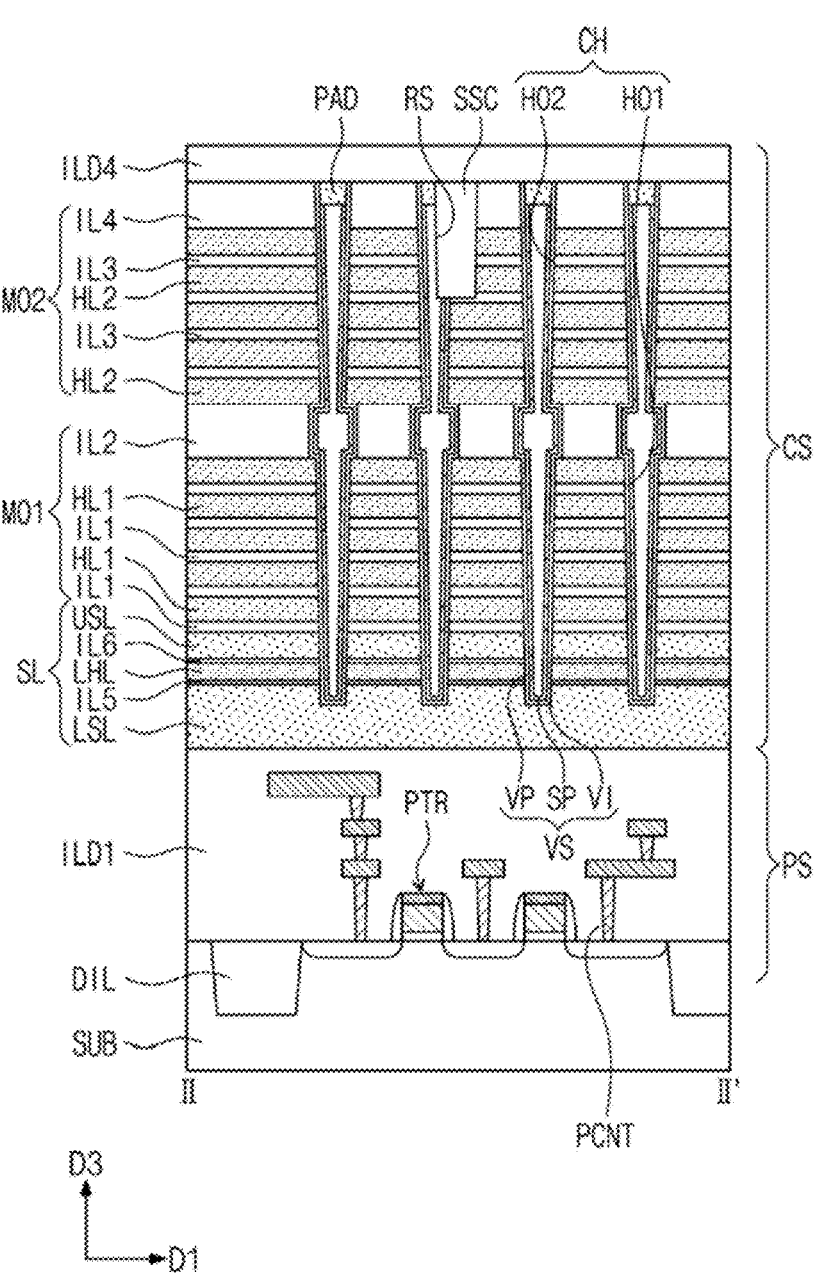

Referring to FIGS. 10, 18A, and 18B, the first and second sacrificial pillars HFI1 and HFI2 may be selectively removed from the first and second holes HO1 and HO2, respectively. A single channel hole CH may be constituted by the empty first and second holes HO1 and HO2 that are spatially connected to each other.

Vertical channel structures VS may be correspondingly formed in the channel holes CH. The formation of the vertical channel structure VS may include sequentially forming a vertical dielectric pattern VP, a vertical semiconductor pattern SP, and a buried dielectric pattern VI on an inner wall of the channel hole CH. The vertical dielectric pattern VP and the vertical semiconductor pattern SP may be conformally formed. A conductive pad PAD may be formed on an upper portion of each of the vertical channel structures VS.

A recess RS may be formed on an upper portion of the second mold layer MO2, defining a cutting structure SSC. The recess RS may penetrate two second sacrificial layers HL2 at top of the second mold layer MO2. The recess RS may partially penetrate an upper portion of the vertical channel structure VS that overlaps the recess RS. The recess RS may be filled with a dielectric material to form the cutting structure SSC. A fourth interlayer dielectric layer ILD4 may be formed on the cutting structure SSC and the conductive pads PAD.

Figure 19A:
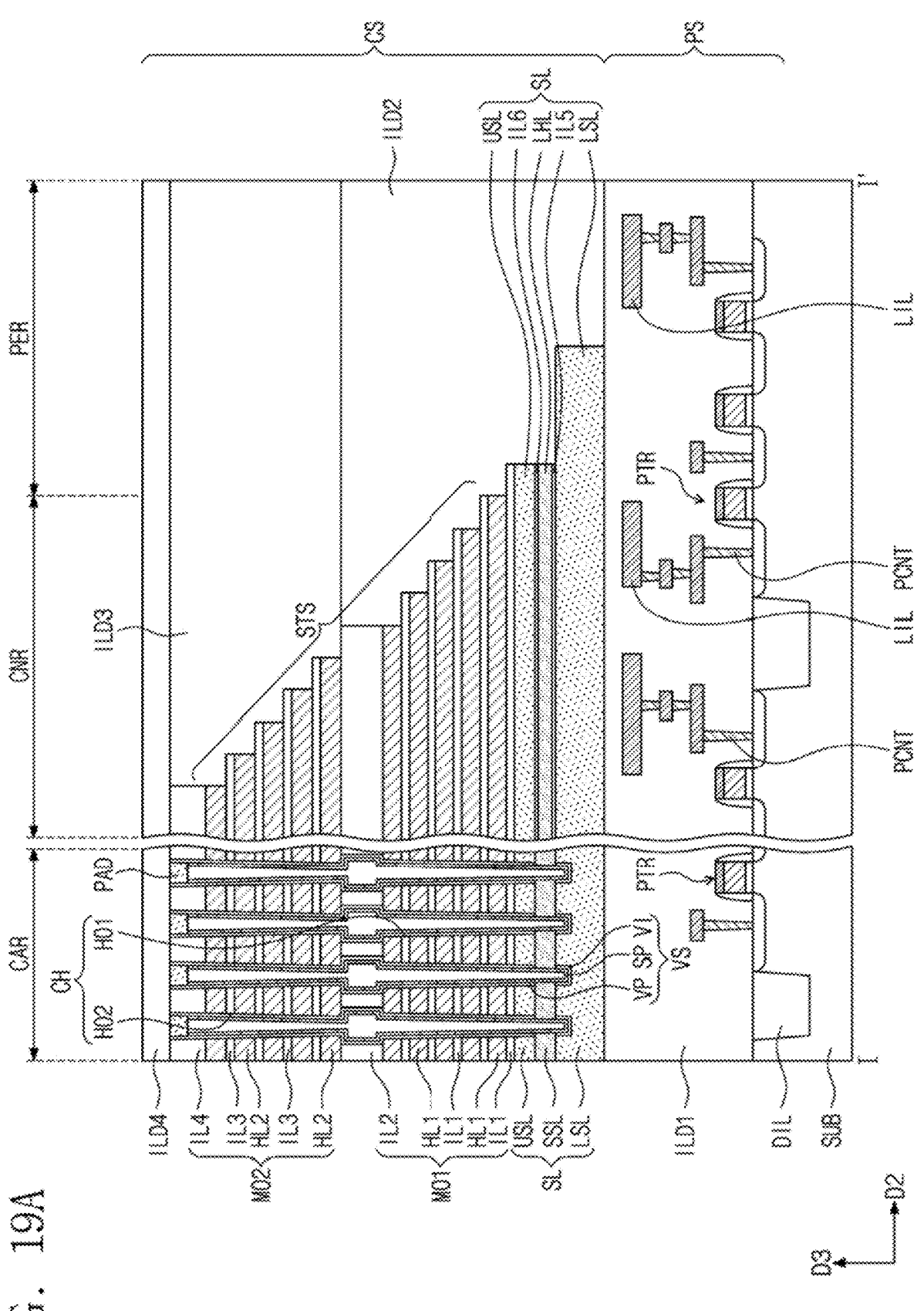
Figure 19B:
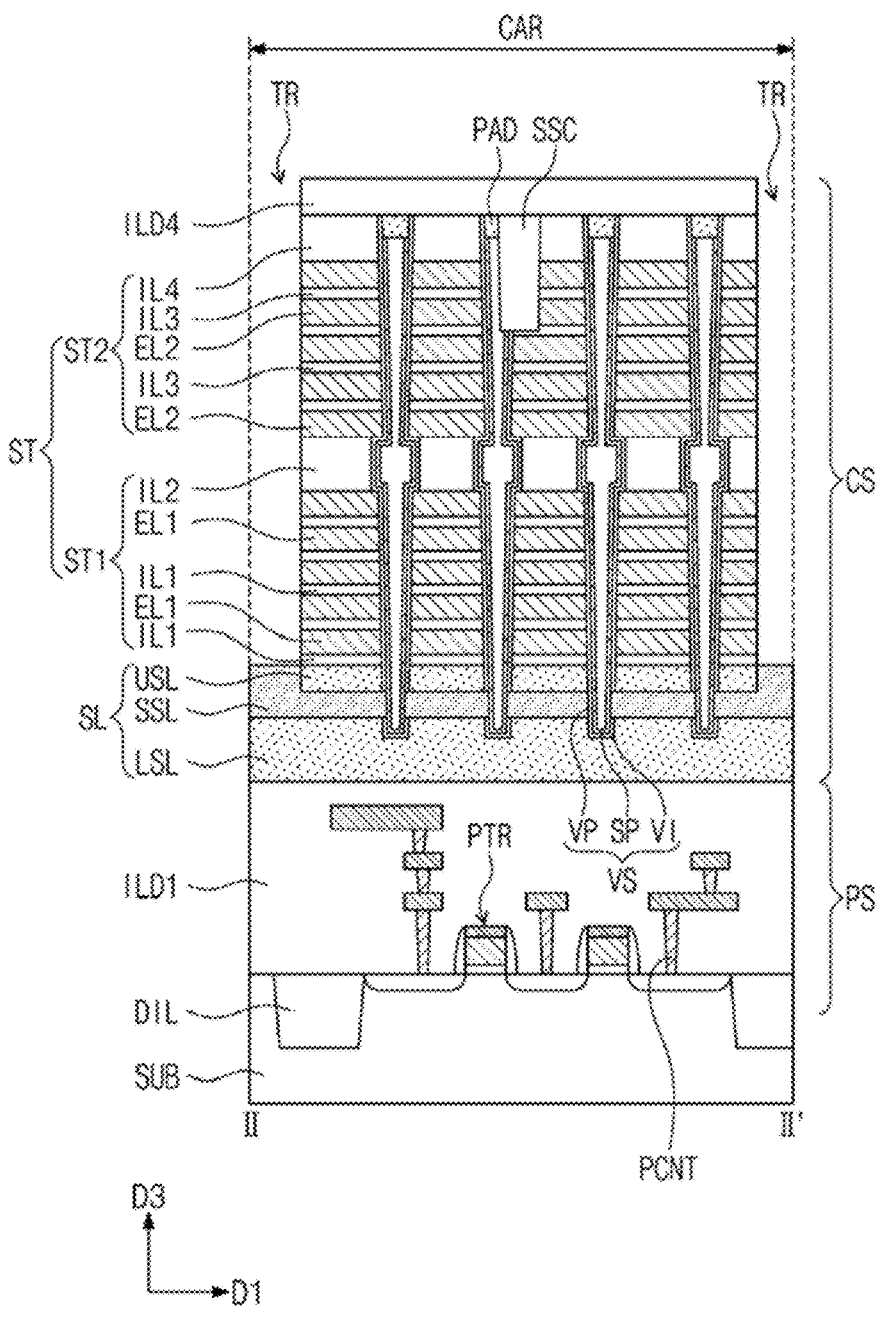

Referring to FIGS. 10, 19A, and 19B, trenches TR may be formed to penetrate the first and second mold layers MO1 and MO2. The trenches TR may be formed by using the cryogenic etching process of the mold layer discussed above with reference to FIGS. 6 to 8.

The trench TR may expose the lower semiconductor layer LSL. The trench TR may expose sidewalls of the first and second sacrificial layers HL1 and HL2. The trench TR may expose a sidewall of the fifth dielectric layer IL5, a sidewall of the lower sacrificial layer LHL, and a sidewall of the sixth dielectric layer IL6.

On the cell array region CAR, the lower sacrificial layer LHL exposed to the trenches TR may be replaced with a source semiconductor layer SSL. For example, the lower sacrificial layer LHL exposed to the trenches TR may be selectively removed. The removal of the lower sacrificial layer LHL may expose a lower portion of the vertical dielectric pattern VP of each of the vertical channel structures VS.

The exposed lower portion of the vertical dielectric pattern VP may be selectively removed. Therefore, a lower portion of the vertical semiconductor pattern SP may be exposed. While the lower portion of the vertical dielectric pattern VP is removed, the fifth and sixth dielectric layers IL5 and IL6 may also be removed.

The source semiconductor layer SSL may be formed in a space where are removed the fifth dielectric layer IL5, the lower sacrificial layer LHL, and the sixth dielectric layer IL6. The source semiconductor layer SSL may be in direct contact with the exposed lower portion of the vertical semiconductor pattern SP. The source semiconductor layer SSL may be in direct contact with the lower semiconductor layer LSL that underlies the source semiconductor layer SSL. The source semiconductor layer SSL may be in direct contact with the upper semiconductor layer USL that overlies the source semiconductor layer SSL. A second substrate SL may be constituted by the lower semiconductor layer LSL, the source semiconductor layer SSL, and the upper semiconductor layer USL on the cell array region CAR.

On the cell array region CAR, the first and second sacrificial layers HL1 and HL2 exposed to the trenches TR may be correspondingly replaced with first and second electrodes EL1 and EL2, with the result that a cell array structure ST may be formed. For example, the first and second sacrificial layers HL1 and HL2 may be selectively removed which are exposed to the trenches TR. The first electrodes EL1 may be formed in spaces from which the first sacrificial layers HL1 are removed, and the second electrodes EL2 may be formed in spaces from which the second sacrificial layers HL2 are removed.

Referring back to FIGS. 10, 11A, and 11B, separation structures SPS may be formed to fill corresponding trenches TR. Cell contact plugs CPLG may be formed to connect to the stepwise structure STS of the cell array structure ST. A source contact plug SPLG may be formed to connect to the lower semiconductor layer LSL. A through via TVS may be formed to connect to the lower line LIL of the low-level layer PS.

Bit-line contacts BPLG may be formed to penetrate the fourth interlayer dielectric layer ILD4 to be coupled to corresponding conductive pads PAD. At least one of the bit-line contacts BPLG may be formed to be coupled to the conductive pad PAD in contact with the cutting structure SSC.

On the fourth interlayer dielectric layer ILD4, bit lines BL may be formed to correspondingly connect to the bit-line contacts BPLG. On the fourth interlayer dielectric layer ILD4, first upper lines UIL1 may be formed to correspondingly connect to the cell contact plugs CPLG. On the fourth interlayer dielectric layer ILD4, a second upper line UIL2 and a third upper line UIL3 may be formed to respectively connect to the source contact plug SPLG and the through via TVS.

A cryogenic etching process according to the present inventive concepts may reduce a production rate of ammonium salt generated from an etch-byproduct during an etching process performed on a mold layer. Thus, the present inventive concepts may reduce or prevent process failure such as etching interruption due to ammonium salt and may form an etching structure whose aspect ratio is high.

A cryogenic etching process according to the present inventive concepts may adjust a supply rate of a process gas including an R—OH compound, and thus it may be possible to form a passivation layer that suppresses horizontal etching and simultaneously to maintain a high etch rate for a mold layer.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A method of fabricating a semiconductor device, the method comprising:

forming a mold layer on a substrate;

forming a hardmask layer on an upper surface of the mold layer such that a portion of the mold layer is exposed by the hardmask layer; and using the hardmask layer to perform, on the mold layer, a cryogenic etching process that uses plasma, wherein the cryogenic etching process includes, supplying a chamber in which the substrate, the mold layer, and the hardmask layer are located with a process gas, the process gas including a first process gas supplied through a first valve and a second process gas supplied through a second valve, the second process gas including an R—OH compound, where R is hydrogen, a $C_1$ to $C_5$ alkyl group, a $C_2$ to $C_6$ alkenyl group, a $C_2$ to $C_6$ alkynyl group, or a phenyl group, gradually increasing a supply rate of the second process gas during the cryogenic etching process, controlling the first valve independently of the second valve such that the supply rate of the second process gas into the chamber is independent of a supply rate of the first process gas into the chamber, and generating the plasma from the process gas, such that radicals of the first process gas etch the portion of the mold layer that is exposed by the hardmask layer, ammonium salt is produced based on the radicals of the first process gas etching the portion of the mold layer that is exposed by the hardmask layer, and the second process gas reduces a production rate of the ammonium salt that is produced during the cryogenic etching process.

2. The method of claim 1, wherein the first process gas includes at least one of $SF_6$, $NF_3$, $XeF_2$, $TaF_5$, IFS, HF, $CIF_3$, $BrF_3$, $AsF_5$, PFS, $NbF_5$, $BiF_5$, $UF_5$, $SiCl_4$, $TaCl_5$, $HfCl_4$, $CoCl_2$, $H_2$, $C_xF_y$, or $C_xH_yF_z$, and x, y, and z are each independently an integer between 1 and 50.

3. The method of claim 1, wherein the R—OH compound is combined with fluorosilicate instead of an ammonium ion to produce a salt that is separate from the ammonium salt.

4. The method of claim 1, wherein the cryogenic etching process is performed at a temperature ranging from −150° C. to 0° C.

5. The method of claim 1, further comprising using the cryogenic etching process to form a hole in the mold layer, the hole extending from the upper surface of the mold layer towards an opposite, lower surface of the mold layer, wherein, during the cryogenic etching process, a passivation layer is produced on an inner sidewall of the hole, the passivation layer including the ammonium salt.

6. The method of claim 5, wherein a thickness of the passivation layer on the inner sidewall of the hole decreases in proportion with increasing distance from an upper end of the hole at the upper surface of the mold layer.

7. The method of claim 1, wherein the supply rate of the second process gas has a first flow rate at a first stage of the cryogenic etching process, the supply rate of the second process gas has a second flow rate at a second stage of the cryogenic etching process, the second stage subsequent to the first stage during the cryogenic etching process, and the second flow rate is 1.1 times to 10 times the first flow rate.

8. The method of claim 1, wherein forming the mold layer includes alternately stacking silicon oxide layers and silicon nitride layers on the substrate.

9. The method of claim 1, wherein the process gas further includes a third process gas, and the third process gas includes at least one of oxygen ($O_2$) or nitrogen ($N_2$).

10. A plasma etching apparatus configured to perform a cryogenic etching process, the plasma etching apparatus comprising:

a chamber;

a gas distribution part on an upper portion of the chamber;

a pedestal on a lower portion of the chamber and configured to support a substrate;

a first gas supply source and a second gas supply source that are connected to the gas distribution part;

a first valve between the first gas supply source and the gas distribution part;

a second valve between the second gas supply source and the gas distribution part; and a controller that is configured to control the plasma etching apparatus to perform the cryogenic etching process using a plasma and a hardmask layer on a mold layer on the substrate, the hardmask layer on an upper surface of the mold layer such that a portion of the mold layer is exposed by the hardmask layer, the cryogenic etching process including supplying a process gas to the chamber in which the substrate, the mold layer, and the hardmask layer are located, the process gas including a first process gas supplied through the first valve and a second process gas supplied through the second valve, the second process gas including an R—OH compound, where R is hydrogen, a $C_1$ to $C_5$ alkyl group, a $C_2$ to $C_6$ alkenyl group, a $C_2$ to $C_6$ alkynyl group, or a phenyl group, gradually increasing a supply rate of the second process gas during the cryogenic etching process, controlling the first valve independently of the second valve such that the supply rate of the second process gas into the chamber is independent of a supply rate of the first process gas into the chamber, and generating the plasma from the process gas, such that radicals of the first process gas etch the portion of the mold layer that is exposed by the hardmask layer, ammonium salt is produced based on the radicals of the first process gas etching the portion of the mold layer that is exposed by the hardmask layer, and the second process gas reduces a production rate of the ammonium salt that is produced during the cryogenic etching process, wherein the first gas supply source is configured to supply the first process gas to the gas distribution part, wherein the second gas supply source is configured to supply the second process gas to the gas distribution part, wherein the plasma etching apparatus is configured to generate the plasma based on using the gas distribution part and the pedestal as a top electrode and a bottom electrode, respectively, such that the plasma produces the radicals of the first process gas, the radicals configured to etch an etch-target layer, and wherein the pedestal includes a coolant passage that is configured to cool the substrate.

11. The plasma etching apparatus of claim 10, wherein the coolant passage is configured to cool the substrate to a temperature ranging from $-150°$ C. to $0°$ C.

12. A mixture of process gases for cryogenic etching, the mixture comprising:

a first process gas that is configured to produce radicals, the radicals configured to etch an etch-target layer;

a second process gas that is configured to suppress ammonium salt from being produced based on a reaction between the radicals and the etch-target layer; and a third process gas that includes at least one of oxygen $(O_2)$ or nitrogen $(N_2)$, wherein the second process gas includes an R—OH compound, and wherein R is a $C_2$ to $C_6$ alkenyl group, a $C_2$ to $C_6$ alkynyl group, or a phenyl group.

13. The mixture of claim 12, wherein the first process gas includes at least one of $SF_6$, $NF_3$, $XeF_2$, $TaF_5$, IFS, HF, $CIF_3$, $BrF_3$, $AsF_5$, PFS, $NbF_5$, $BiF_5$, $UF_5$, $SiCl_4$, $TaCl_5$, $HfCl_4$, $CoCl_2$, $H_2$, $C_xF_y$, or $C_xH_yF_z$, and x, y, and z are each independently an integer between 1 and 50.

14. The mixture of claim 12, wherein the R—OH compound is configured to be combined with fluorosilicate instead of an ammonium ion to produce a salt that is separate from the ammonium salt.

15. The mixture of claim 12, wherein, R is a $C_2$ to $C_6$ alkenyl group.

16. The mixture of claim 12, wherein R is a $C_2$ to $C_6$ alkynyl group.

17. The mixture of claim 12, wherein R is a phenyl group.

18. The mixture of claim 12, wherein the first process gas includes at least one of $SF_6$, $NF_3$, $XeF_2$, $TaF_5$, IFS, HF, $CIF_3$, $BrF_3$, $AsF_5$, PFS, $NbF_5$, $BiF_5$, $UF_5$, $SiCl_4$, $TaCl_5$, $HfCl_4$, $CoCl_2$, $C_xF_y$, $C_xH_yF_z$, and x, y, and z are each independently an integer between 1 and 50.

* * * * *